(12) United States Patent  
Lanka et al.

(10) Patent No.: US 12,321,305 B2
(45) Date of Patent: Jun. 3, 2025

(54) SIDEBAND INTERFACE FOR DIE-TO-DIE INTERCONNECTS

(71) Applicant: Intel Corporation, Santa Clara, CA (US)

(72) Inventors: Narasimha Lanka, Dublin, CA (US); Swadesh Choudhary, Mountain View, CA (US); Debendra Das Sharma, Saratoga, CA (US); Lakshmipriya Seshan, Sunnyvale, CA (US); Zuoguo Wu, San Jose, CA (US); Gerald Pasdast, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 502 days.

(21) Appl. No.: 17/708,367

(22) Filed: Mar. 30, 2022

(65) Prior Publication Data

US 2022/0222198 A1 Jul. 14, 2022

Related U.S. Application Data

(60) Provisional application No. 63/292,948, filed on Dec. 22, 2021.

(51) Int. Cl.
*G06F 13/42* (2006.01)
*G06F 13/40* (2006.01)
(Continued)

(52) U.S. Cl.
CPC ........ *G06F 13/4273* (2013.01); *G06F 13/405* (2013.01); *H01L 23/5383* (2013.01);
(Continued)

(58) Field of Classification Search
None
See application file for complete search history.

(56) References Cited

U.S. PATENT DOCUMENTS 7,936,779 B2 5/2011 Risberg et al.
8,782,321 B2 7/2014 Harriman et al.
(Continued)

FOREIGN PATENT DOCUMENTS

CN 105765544 4/2019
EP 2390969 11/2011
(Continued)

OTHER PUBLICATIONS

International Searching Authority, International Search Report and Written Opinion dated Mar. 13, 2023 in International Application No. PCT/US2022/049772 (12 pages).
(Continued)

*Primary Examiner* — Scott C Sun
(74) *Attorney, Agent, or Firm* — Eversheds Sutherland (US) LLP

(57) ABSTRACT

In one embodiment, an apparatus includes: a die-to-die adapter to communicate with protocol layer circuitry and physical layer circuitry; and the physical layer circuitry coupled to the die-to-die adapter, where the physical layer circuitry is to receive and output first information to a second die via an interconnect. The physical layer circuitry may include: a first sideband data receiver to couple to a first sideband data lane and a first sideband clock receiver to couple to a first sideband clock lane; and a second sideband data receiver to couple to a second sideband data lane and a second sideband clock receiver to couple to a second sideband clock lane. The physical layer circuitry may assign a functional sideband comprising: one of the first or second sideband data lanes; and one of the first or second sideband clock lanes. Other embodiments are described and claimed.

20 Claims, 14 Drawing Sheets

(51) Int. Cl.
  *H01L 23/538* (2006.01)
  *H01L 25/065* (2023.01)
  *H01L 23/00* (2006.01)

(52) U.S. Cl.
  CPC .. *H01L 25/0655* (2013.01); *G06F 2213/0024* (2013.01); *G06F 2213/0026* (2013.01); *H01L 24/16* (2013.01); *H01L 2224/16225* (2013.01)

(56) References Cited

U.S. PATENT DOCUMENTS

| | | |
|---|---|---|
| 8,856,420 B2 | 10/2014 | Chandra et al. |
| 8,953,644 B2 | 2/2015 | Chandra et al. |
| 9,164,535 B2 | 10/2015 | Chandra et al. |
| 9,772,970 B2 | 9/2017 | Luo et al. |
| 9,785,556 B2 | 10/2017 | Sundararaman et al. |
| 9,804,989 B2 | 10/2017 | Klein |
| 10,606,785 B2 | 3/2020 | Das Sharma et al. |
| 10,614,000 B2 | 4/2020 | Agarwal et al. |
| 10,698,842 B1 | 6/2020 | Dastidar et al. |
| 10,817,462 B1 | 10/2020 | Dastidar et al. |
| 10,848,595 B2 | 11/2020 | Song et al. |
| 11,030,126 B2 | 6/2021 | Koufaty et al. |
| 11,036,650 B2 | 6/2021 | Agarwal |
| 11,194,505 B2 | 12/2021 | Lee et al. |
| 11,201,838 B2 | 12/2021 | Marolia et al. |
| 11,232,058 B2 | 1/2022 | Jen et al. |
| 2011/0179212 A1 | 7/2011 | Hartman |
| 2013/0262948 A1 | 10/2013 | Takehara |
| 2014/0114928 A1 | 4/2014 | Beers |
| 2014/0372663 A1 | 12/2014 | Chandra et al. |
| 2015/0032917 A1 | 1/2015 | Nguyen |
| 2015/0089110 A1 | 3/2015 | Harriman et al. |
| 2018/0025789 A1 | 1/2018 | Dono et al. |
| 2018/0109446 A1 | 4/2018 | Srinivasan et al. |
| 2018/0300275 A1 | 10/2018 | Wu et al. |
| 2019/0004990 A1 | 1/2019 | Van Doren et al. |
| 2019/0095215 A1 | 3/2019 | Teoh et al. |
| 2020/0042471 A1 | 2/2020 | Kerr et al. |
| 2020/0044895 A1 | 2/2020 | Mittal et al. |
| 2020/0278733 A1 | 9/2020 | Li et al. |
| 2020/0356436 A1 | 11/2020 | Iyer et al. |
| 2020/0394148 A1 | 12/2020 | Regan et al. |
| 2020/0394150 A1* | 12/2020 | Lanka ............... G06F 13/4226 |
| 2021/0097015 A1 | 4/2021 | Das Sharma et al. |
| 2021/0224156 A1 | 7/2021 | Cho et al. |
| 2021/0399982 A1 | 12/2021 | Das Sharma et al. |
| 2022/0222198 A1 | 7/2022 | Lanka et al. |
| 2022/0237138 A1 | 7/2022 | Lanka et al. |
| 2022/0318111 A1 | 10/2022 | Choudhary et al. |
| 2022/0327083 A1 | 10/2022 | Das Sharma et al. |
| 2022/0327276 A1 | 10/2022 | Seshan et al. |

FOREIGN PATENT DOCUMENTS

| | | |
|---|---|---|
| EP | 3037972 | 6/2016 |
| WO | 2015099719 | 7/2015 |
| WO | 2019009970 | 1/2019 |

OTHER PUBLICATIONS

International Searching Authority, International Search Report and Written Opinion dated Apr. 4, 2023 in International Application No. PCT/US2022/050653 (13 pages).

International Searching Authority, International Search Report and Written Opinion dated Apr. 5, 2023 in International Application No. PCT/US2022/050656 (13 pages).

International Searching Authority, International Search Report and Written Opinion dated Apr. 7, 2023 in International Application No. PCT/US2022/050657 (11 pages).

International Searching Authority, International Search Report and Written Opinion dated Apr. 14, 2023 in International Application No. PCT/US2022/050655 (11 pages).

Dr. Debendra Das Sharma, Universal Chiplet Interconnect Express (UCIe)®: Building an open chiplet ecosystem, Property of Universal Chiplet Interconnect Express (UCIe) 2022, 7 pgs.

Universal Chiplet Interconnect Express (UCIe), Universal Chiplet Interconnect Express (UCIe) Specification Revision 1.0, Feb. 24, 2022, 288 pgs.

U.S. Appl. No. 17/844,348, filed Jun. 20, 2022, entitled "Compliance and Debug Methods for Die-To-Die (D2D) Interconnects," by Debendra Das Sharma, et al., 43 pgs.

U.S. Appl. No. 17/844,356, filed Jun. 20, 2022 entitled "Lane Repair and Lane Reversal Implementation for Die-To-Die (D2D) Interconnects," by Lakshmipriya Seshan, et al., 51 pgs.

U.S. Appl. No. 17/708,386, filed Mar. 30, 2022, entitled "Link Initialization Training and Bring up for Die-To-Die Interconnect," by Narasimha Lanka, et al., 46 pgs.

U.S. Appl. No. 17/844,366, filed Jun. 20, 2022, entitled "Standard Interfaces for Die ro Die (D2D) Interconnect Stacks," by Swadesh Choudhary, et al., 44 pgs.

* cited by examiner

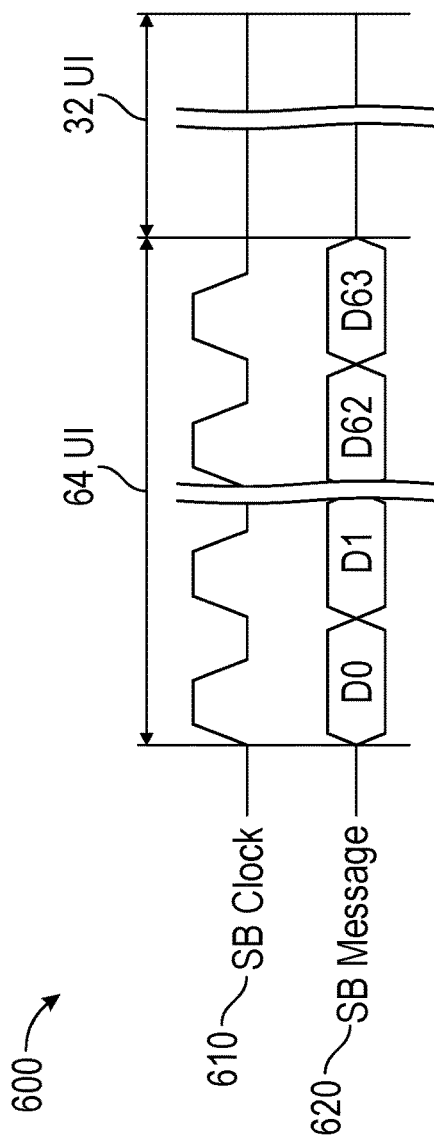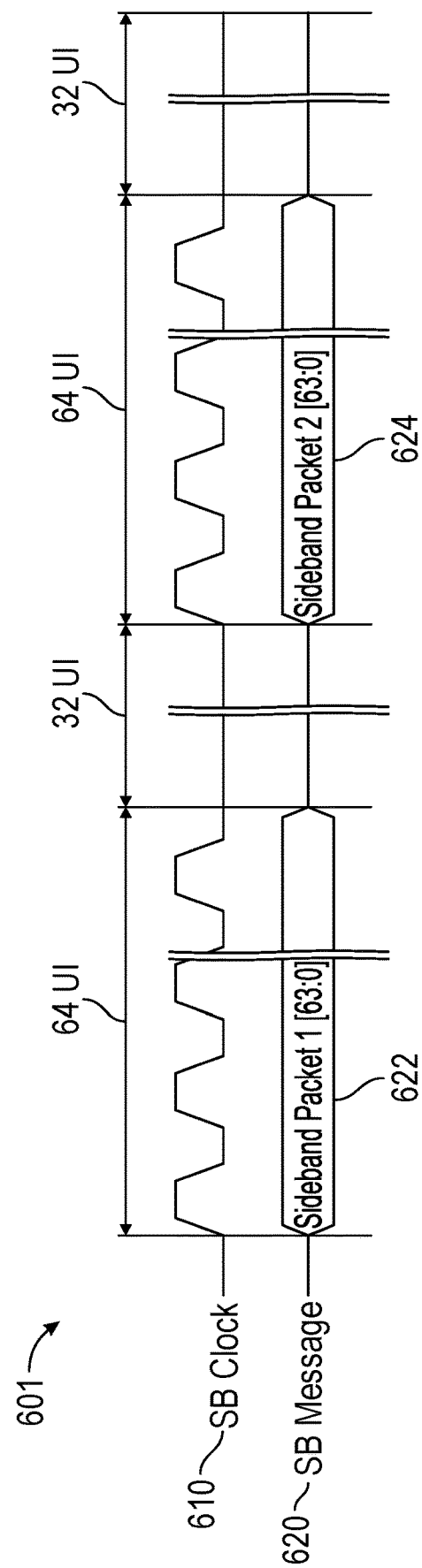
FIG. 6A
FIG. 6B

SIDEBAND INTERFACE FOR DIE-TO-DIE INTERCONNECTS

CROSS-REFERENCE TO RELATED APPLICATION

This application claims the benefit of U.S. Provisional Application No. 63/292,948, filed on Dec. 22, 2021, in the name of Narasimha Lanka, Swadesh Choudhary, Debendra Das Sharma, Lakshmipriya Seshan, Zuoguo Wu and Gerald Pasdast entitled "Sideband Interface And Encoding For Die To Die (D2D) Chiplet Exchange Interconnect (CXI) Interconnects."

BACKGROUND

Advancements in multi-chip packaging (MCP) enables performance growth and creation of complex products. High density, low latency die-to-die interconnects optimized for short reach are capable of high data rates and very low bit error rates (BERs). Die-to-die links within such packages may seek to realize synchronization related to package trace transmission, link state machines and link state transitions. A mechanism to exchange this information is used to perform bring up and operation of connected devices. While this information can be communicated over a main band, such communication reduces aggregate bandwidth.

BRIEF DESCRIPTION OF THE DRAWINGS

FIGS. 6A/6B are timing diagrams illustrating sideband signaling in accordance with an embodiment.

DETAILED DESCRIPTION

Figure 1:
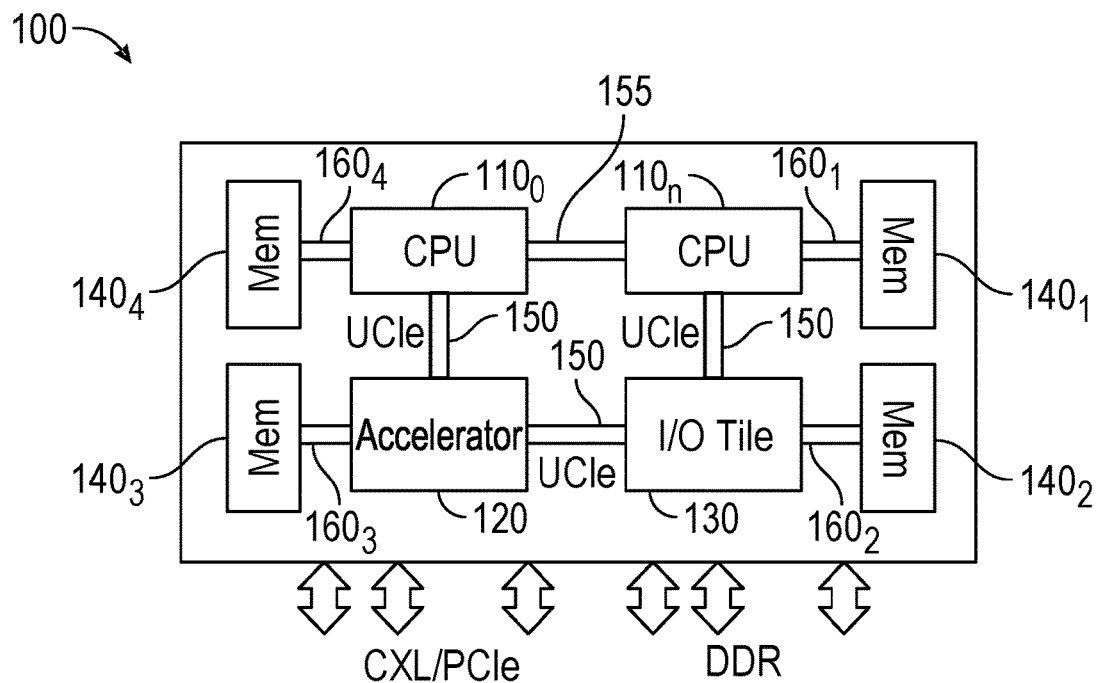
FIG. 1 is a block diagram of a package in accordance with an embodiment.

In various embodiments, a sideband of a multi-protocol capable, on-package interconnect may be used to communicate various information types, and may be leveraged to realize a faster bring up and initialization of a package having multiple die coupled via such interconnects. In addition, in some packaging implementations, redundant sideband circuitry may be included and used to provide redundancy in case of errors, and to further enable higher bandwidths for sideband communication.

In various embodiments, a multi-protocol capable, on-package interconnect may be used to communicate between disaggregated dies of a package. This interconnect can be initialized and trained by an ordered bring up flow to enable independent reset of the different dies, detection of partner dies' reset exit, and an ordered initialization and training of sideband and mainband interfaces of the interconnect (in that order). More specifically, a sideband initialization may be performed to detect that a link partner die has exited reset and to initialize and train the sideband. Thereafter the mainband may be initialized and trained, which may include any lane reversal and/or repair operations as described further herein. Such mainband operations may leverage the already brought up sideband to communicate synchronization and status information.

With embodiments that perform lane reversal and/or repair, yield loss due to lane connectivity issues for advanced package multi-chip packages (MCPs) can be recovered. Further, by way of lane repair techniques in accordance with an embodiment, both left and right shift techniques may cover an entire bump map for efficient lane repair. Still further lane reversal detection may enable die rotation and die mirroring to enable multiple on-package instantiations with the same die. In this way, lane reversal may eliminate multiple tape-ins of the same die.

Embodiments may be implemented in connection with a multi-protocol capable, on-package interconnect protocol that may be used to connect multiple chiplets or dies on a single package. With this interconnect protocol, a vibrant ecosystem of disaggregated die architectures can be interconnected together. This on-package interconnect protocol may be referred to as a "Universal Chiplet Interconnect express" (UCIe) interconnect protocol, which may be in accordance with a UCIe specification as may be issued by a special interest group (SIG) or other promotor, or other entity. While termed herein as "UCIe," understand that the multi-protocol capable, on-package interconnect protocol may adopt another nomenclature.

This UCIe interconnect protocol may support multiple underlying interconnect protocols, including flit-based modes of certain communication protocols. In one or more embodiments, the UCIe interconnect protocol may support: a flit mode of a Compute Express Limited (CXL) protocol such as in accordance with a given version of a CXL specification such as the CXL Specification version 2.0 (published November 2020), any future update, version or variation thereof; a Peripheral Component Interconnect express (PCIe) flit mode such as in accordance with a given version of a PCIe specification such as the PCIe Base Specification version 6.0 (published 2022) or any future update, version or variation thereof; and a raw (or streaming) mode that be used to map any protocol supported by link partners. Note that in one or more embodiments, the UCIe interconnect protocol may not be backwards-compatible, and instead may accommodate current and future versions of the above-described protocols or other protocols that support flit modes of communication.

Embodiments may be used to provide compute, memory, storage, and connectivity across an entire compute continuum, spanning cloud, edge, enterprise, 5G, automotive, high-performance computing, and hand-held segments. Embodiments may be used to package or otherwise couple dies from different sources, including different fabs, different designs, and different packaging technologies.

Chiplet integration on package also enables a customer to make different trade-offs for different market segments by choosing different numbers and types of dies. For example, one can choose different numbers of compute, memory, and I/O dies depending on segment. As such, there is no need for a different die design for different segments, resulting in lower product stock keeping unit (SKU) costs.

Referring now to FIG. 1, shown is a block diagram of a package in accordance with an embodiment. As shown in FIG. 1, package 100 may be any type of integrated circuit package. In the particular illustration shown, package 100 includes multiple chiplets or dies, including central processing unit (CPU) dies 110$_{0-n}$, an accelerator die 120, an input/output (I/O) tile 130, and memory 140$_{1-4}$. At least certain of these dies may be coupled together via on-package interconnects in accordance with an embodiment. As shown, interconnects 150$_{1-3}$ may be implemented as UCIe interconnects. CPUs 110 may couple via another on-package interconnect 155 which, in some cases, may provide CPU-to-CPU connectivity on-package using a UCIe interconnect that runs a coherency protocol. As one such example, this coherency protocol may be an Intel Ultra Path interconnect (UPI); of course other examples are possible.

While the protocols mapped to the UCIe protocol discussed herein include PCIe and CXL, understand embodiments are not limited in this regard. In example embodiments, mappings for any underlying protocols may be done using a flit format, including the raw mode. In an implementation, these protocol mappings may enable more on-package integration by replacing certain physical layer circuitry (e.g., a PCIe SERDES PHY and PCIe/CXL LogPHY along with link level retry) with a UCIe die-to-die adapter and PHY in accordance with an embodiment to improve power and performance characteristics. In addition, the raw mode may be protocol-agnostic to enable other protocols to be mapped, while allowing usages such as integrating a stand-alone SERDES/transceiver tile (e.g., ethernet) on-package. As further shown in FIG. 1, off-package interconnects may be in accordance with various protocols, including CXL/PCIe protocols, double data rate (DDR) memory interconnect protocols and so forth.

In an example implementation, accelerator 120 and/or I/O tile 130 can be connected to CPU(s) 110 using CXL transactions running on UCIe interconnects 150, leveraging the I/O, coherency, and memory protocols of CXL. In the embodiment of FIG. 1, I/O tile 130 can provide an interface to external CXL, PCIe and DDR pins of the package. Statically or dynamically, accelerator 120 can also be connected to CPUs 110 using PCIe transactions running on UCIe interconnects 150.

Packages in accordance with an embodiment may be implemented in many different types of computing devices, ranging from small portable devices such as smartphones and so forth, up to larger devices including client computing devices and server or other datacenter computing devices. In this way, UCIe interconnects may enable local connectivity and long-reach connectivity at rack/pod levels. Although not shown in FIG. 1, understand that at least one UCIe retimer may be used to extend the UCIe connectivity beyond the package using an off-package interconnect. Examples of off-package interconnects include electrical cables, optical cables or any other technology to connect packages at a rack/pod level.

Embodiments may further be used to support a rack/pod-level disaggregation using a CXL 2.0 (or later) protocol. In such arrangement, multiple compute nodes (e.g., a virtual hierarchy) from different compute chassis couple to a CXL switch that can couple to multiple CXL accelerators/Type-3 memory devices, which can be placed in one or more separate drawers. Each compute drawer may couple to the switch using an off-package Interconnect running a CXL protocol through a UCIe retimer.

Figure 2A:
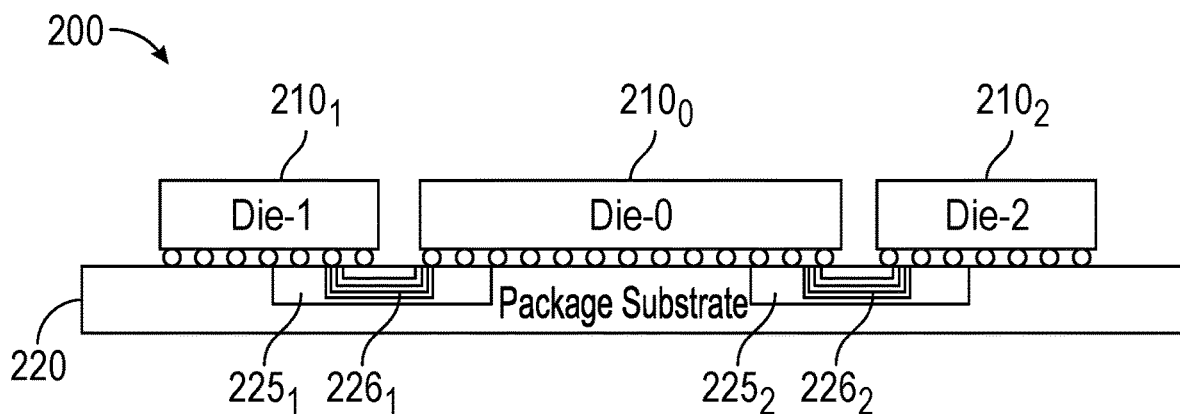
FIGS. 2A-2D are cross-sectional views of different packaging options incorporating embodiments.

Referring now to FIGS. 2A-2D, shown are cross-sectional views of different packaging options incorporating embodiments. As illustrated in FIG. 2A, package 200 may be an advanced package that provides advanced packaging technology. In one or more embodiments, an advanced package implementation may be used for performance optimized applications, including power-efficient performance applications. In some such example use cases, a channel reach may be short (e.g., less than 2 mm) and the interconnect can be optimized for high bandwidth and low latency with best performance and power efficiency characteristics.

As illustrated in FIG. 2A, package 200 includes a plurality of die 210$_{0-2}$. Understand while three specific die are shown in FIG. 2A, many more die may be present in other implementations. Die 210 are adapted on a package substrate 220. In one or more embodiments, die 210 may be adapted to substrate 220 via bumps. As illustrated, package substrate 220 includes a plurality of silicon bridges 225$_{1-2}$ that include on-package interconnects 226$_{1-2}$. Interconnects 226 may be implemented as UCIe interconnects, and silicon bridges 225 may be implemented as Intel EMIB bridges, in an embodiment.

Figure 2B:
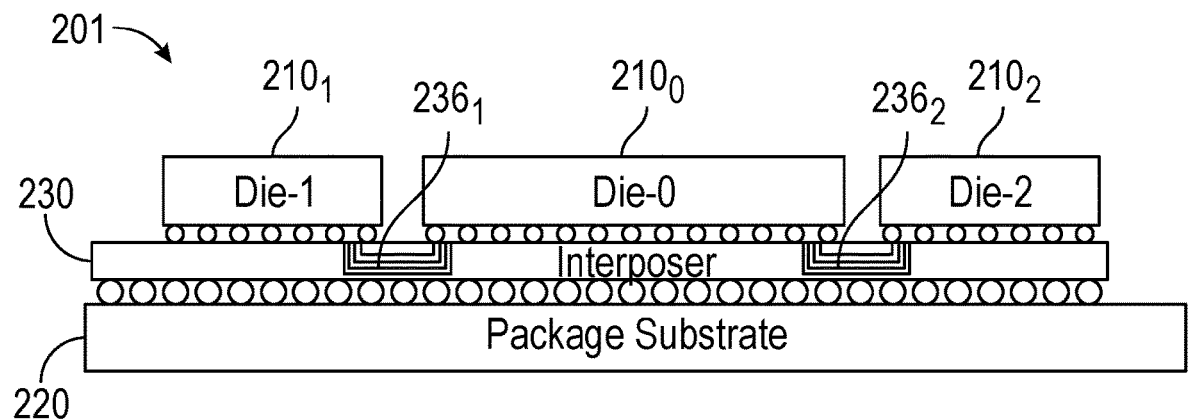

Referring now to FIG. 2B, shown is another embodiment of an advanced package, in which a package configuration is implemented as a Chip on Wafer on Substrate (CoWoS). In this illustration, package 201 includes die 210 that are adapted on an interposer 230, where this interposer includes corresponding on-package interconnects 236. In turn, interposer 230 adapts to package substrate 220 via bumps.

Figure 2C:
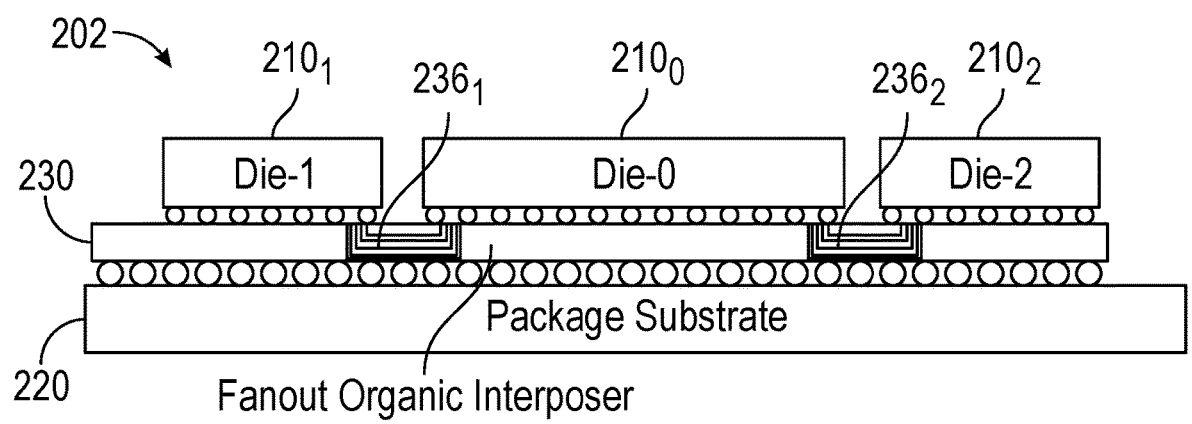

Referring now to FIG. 2C, shown is another embodiment of an advanced package, in which a package configuration is implemented with a fanout organic interposer 230. In this illustration, package 202 includes die 210 that are adapted on interposer 230 including corresponding on-package interconnects 236. In turn, interposer 230 adapts to package substrate 220 via bumps.

Figure 2D:
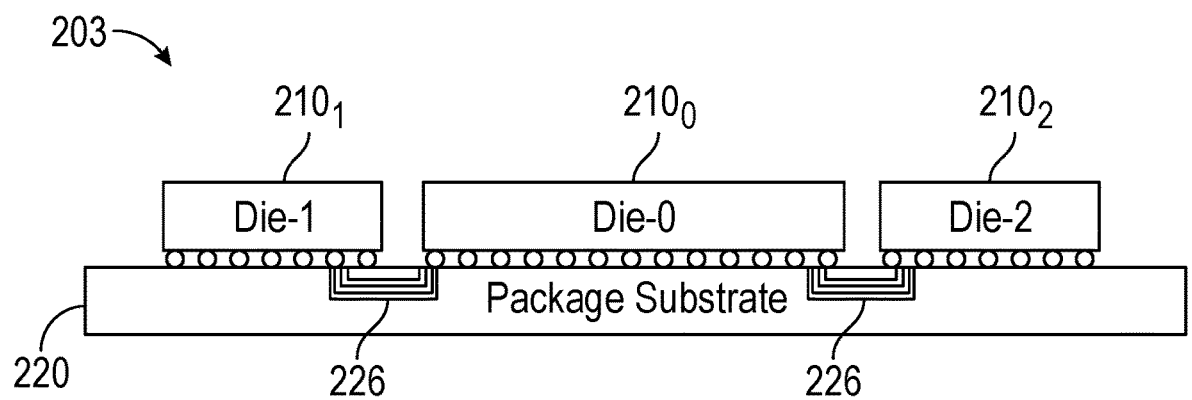

Referring now to FIG. 2D, shown is another package illustration. Package 203 may be a standard package that provides standard packaging technology. In one or more embodiments, a standard package implementations may be used for low cost and long reach (e.g., 10 mm to 25 mm) interconnects using traces on organic package/substrate, while still providing significantly better BER characteristics compared to an off-package SERDES. In this implementation, package 203 includes die 210 adapted to package substrate 220 where on-package interconnects 226 are adapted within package substrate 220 directly, without inclusion of silicon bridges or so forth.

Figure 3A:
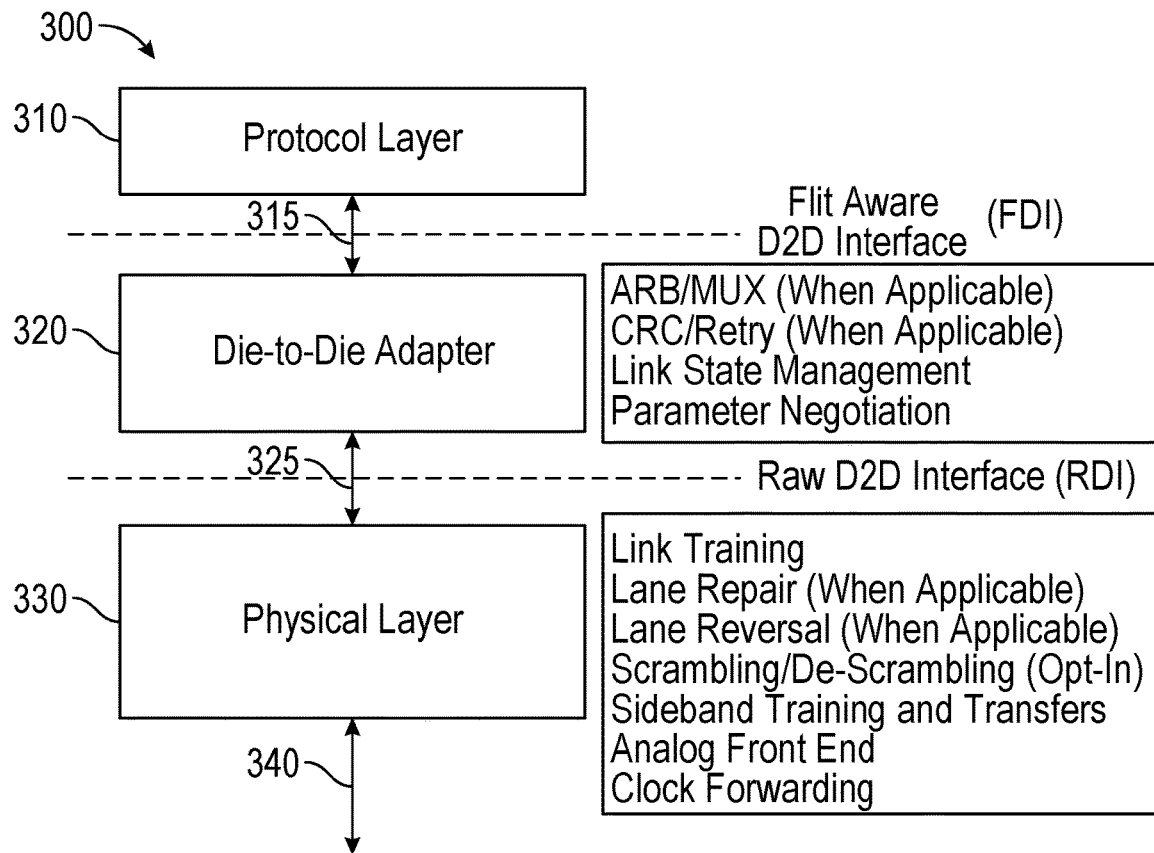
FIGS. 3A/3B is a block diagram of a layered protocol that may implement one or more embodiments.

Referring now to FIGS. 3A/3B, shown is a block diagram of a layered protocol that may implement one or more embodiments. As illustrated in the high level of FIG. 3A, multiple layers of a layered protocol implemented in a circuit 300 may implement an interconnect protocol. A protocol layer 310 may communicate information of one or more application-specific protocols. Protocol layer 310 may operate, in one or more implementations, according to one or more of a PCIe or CXL flit mode, and/or a streaming protocol to offer generic modes for a user-defined protocol to be transmitted. For each protocol, different optimizations and associated flit transfers are available.

In turn, protocol layer 310 couples to a die-to-die adapter (D2D) adapter 320 via an interface 315. In an embodiment, interface 315 may be implemented as a flit-aware D2D interface (FDI). In an embodiment, D2D adapter 320 may be configured to coordinate with protocol layer 310 and a physical layer 330 to ensure successful data transfer across a UCIe link 340. Adapter 320 may be configured to minimize logic on the main data path as much as possible, giving a low latency, optimized data path for protocol flits.

FIG. 3A illustrates various functionality performed within D2D adapter 320. D2D adapter 320 may provide link state management and parameter negotiation for connected dies (also referred to as "chiplets"). Still further D2D adapter 320 may optionally guarantee reliable delivery of data through cyclic redundancy check (CRC) and link level retry mechanism, e.g., where a raw BER is less than 1e-27. When multiple protocols are supported, D2D adapter 320 may define the underlying arbitration mechanism. For example, when transporting communications of a CXL protocol, adapter 320 may provide arbitrator/multiplexer (ARB/MUX) functionality that supports communications of multiple simultaneous protocols. In one or more embodiments a flow control unit (flit) of a given size, e.g., 256 bytes, may define the underlying transfer mechanism when D2D adapter 320 is responsible for reliable transfer.

When operation is in a flit mode, die-to-die adapter 320 may insert and check CRC information. In contrast, when operation is in a raw mode, all information (e.g., bytes) of a flit are populated by protocol layer 310. If applicable, adapter 320 may also perform retry. Adapter 320 may further be configured to coordinate higher level link state machine management and bring up, protocol options related parameter exchanges with a remote link partner, and when supported, power management coordination with the remote link partner. Different underlying protocols may be used depending on usage model. For example, in an embodiment data transfer using direct memory access, software discovery, and/or error handling, etc. may be handled using PCIe/CXL.io; memory use cases may be handled through CXL.Mem; and caching requirements for applications such as accelerators can be handled using CXL.cache.

Figure 3B:
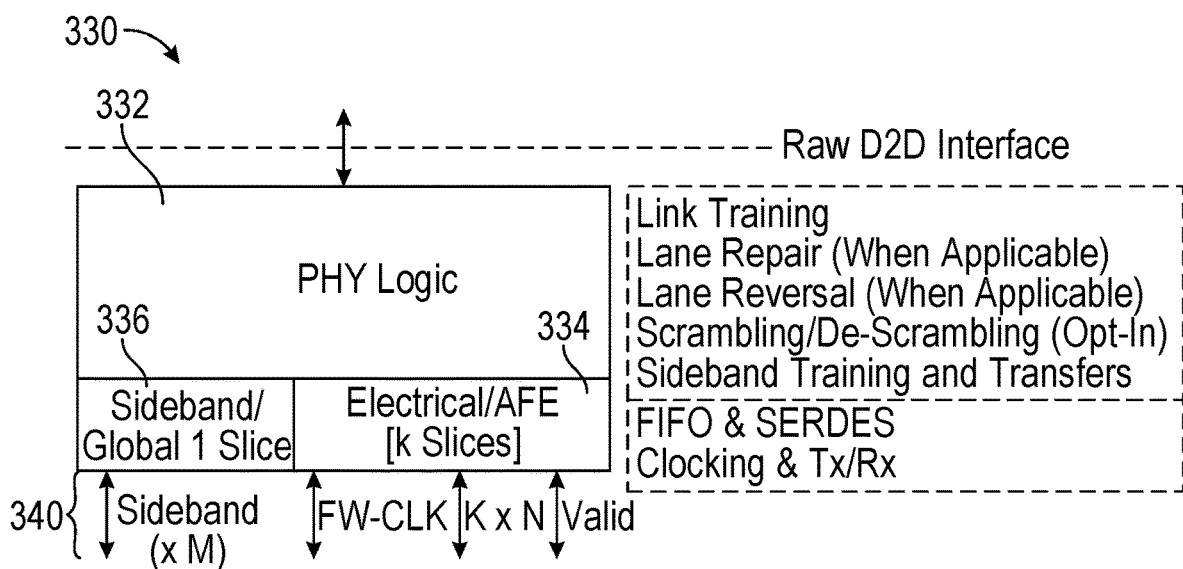

In turn, D2D adapter 320 couples to physical layer 330 via an interface 325. In an embodiment, interface 325 may be a raw D2D interface (RDI). As illustrated in FIG. 3B, physical layer 330 includes circuitry to interface with die-to-die interconnect 340 (which in an embodiment may be a UCIe interconnect or another multi-protocol capable on-package interconnect). In one or more embodiments, physical layer 330 may be responsible for the electrical signaling, clocking, link training, sideband, etc.

Interconnect 340 may include sideband and mainband links, which may be in the form of so-called "lanes," which are physical circuitry to carry signaling. In an embodiment, a lane may constitute circuitry to carry a pair of signals mapped to physical bumps or other conductive elements, one for transmission, and one for reception. In an embodiment, a xN UCIe link is composed of N lanes.

As illustrated in FIG. 3B, physical layer 330 includes three sub-components, namely a physical (PHY) logic 332, an electrical/analog front end (AFE) 334, and a sideband circuitry 336. In an embodiment, interconnect 340 includes a main band interface that provides a main data path on the physical bumps can be organized as a group of lanes called a Module or a Cluster.

The unit of construction of interconnect 340 is referred to herein equally as a "cluster" or "module." In an embodiment, a cluster may include N single-ended, unidirectional, full-duplex data lanes, one single-ended lane for Valid, one lane for tracking, a differential forwarded clock per direction, and 2 lanes per direction for sideband (single-ended clock and data). Thus a Module (or Cluster) forms the atomic granularity for the structural design implementation of AFE 334. There may be different numbers of lanes provided per Module for standard and advanced packages. For example, for a standard package 16 lanes constitute a single Module, while for an advanced package 64 lanes constitute a single Module. Although embodiments are not limited in this regard, interconnect 340 is a physical interconnect that may be implemented using one or more of conductive traces, conductive pads, bumps and so forth that provides for interconnection between PHY circuitry present on link partner dies.

A given instance of protocol layer 310 or D2D adapter 320 can send data over multiple Modules where bandwidth scaling is implemented. The physical link of interconnect 340 between dies may include two separate connections: (1) a sideband connection; and (2) a main band connection. In embodiments, the sideband connection is used for parameter exchanges, register accesses for debug/compliance and coordination with remote partner for link training and management.

In one or more embodiments, a sideband interface is formed of at least one data lane and at least one clock lane in each direction. Stated another way, a sideband interface is a two-signal interface for transmit and receive directions. In an advanced package usage, redundancy may be provided with an additional data and clock pair in each direction for repair or increased bandwidth. The sideband interface may include a forwarded clock pin and a data pin in each direction. In one or more embodiments, a sideband clock signal may be generated by an auxiliary clock source configured to operate at 800 MHz regardless of main data path speed. Sideband circuitry 336 of physical layer 330 may be provided with auxiliary power and be included in an always on domain. In an embodiment, sideband data may be communicated at a 800 megatransfers per second (MT/s) single data rate signal (SDR). The sideband may be configured to run on a power supply and auxiliary clock source which are always on. Each Module has its own set of sideband pins.

The main band interface, which constitutes the main data path, may include a forwarded clock, a data valid pin, and N lanes of data per Module. For an advanced package option, N=64 (also referred to as x64) and overall four extra pins for lane repair are provided in a bump map. For a standard package option, N=16 (also referred to as x16) and no extra pins for repair are provided. Physical layer 330 may be configured to coordinate the different functions and their relative sequencing for proper link bring up and management (for example, sideband transfers, main-band training and repair etc.).

In one or more embodiments, advanced package implementations may support redundant lanes (also referred to herein as "spare" lanes) to handle faulty lanes (including clock, valid, sideband, etc.). In one or more embodiments, standard package implementations may support lane width degradation to handle failures. In some embodiments, multiple clusters can be aggregated to deliver more performance per link.

Figure 4A:
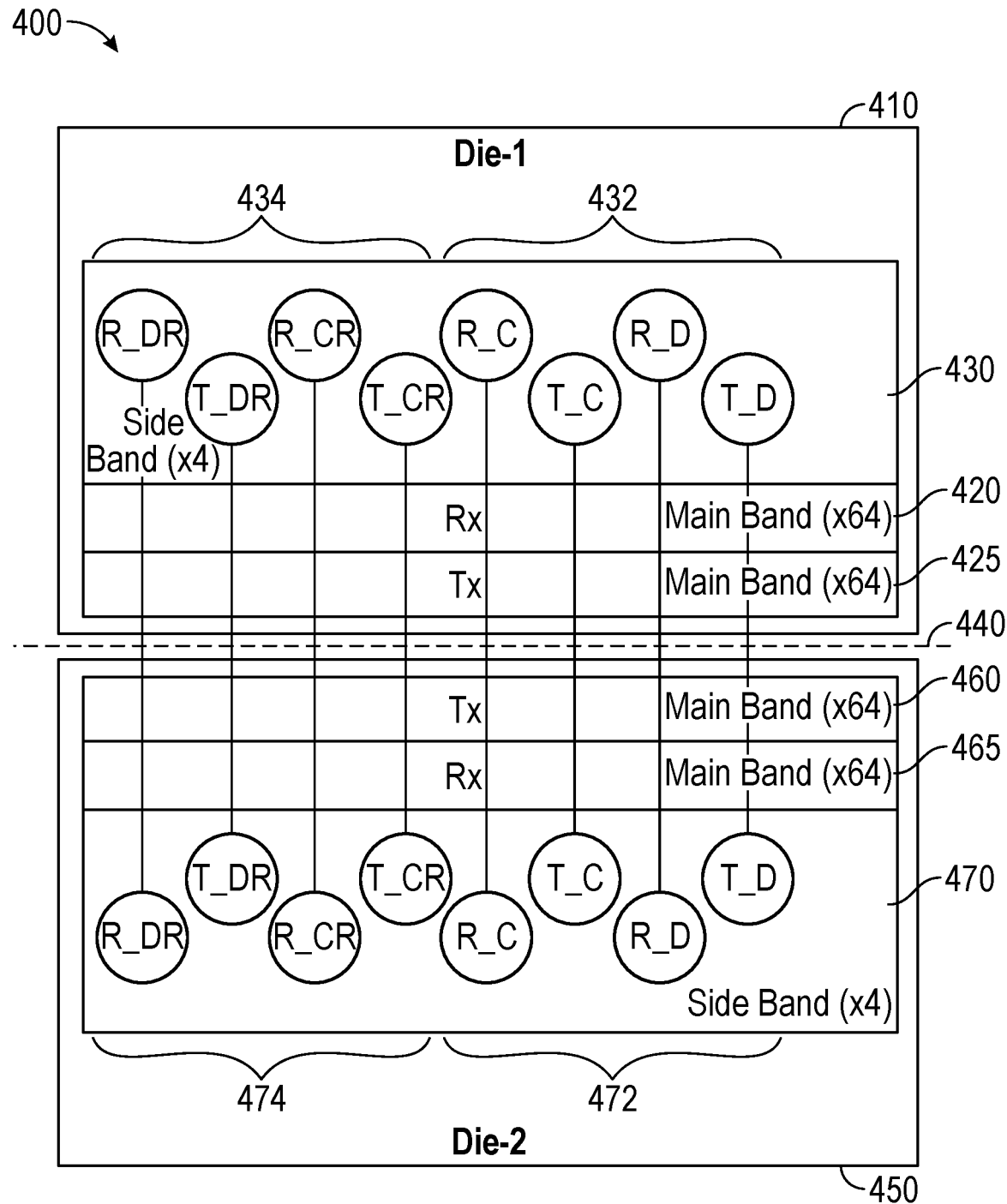
FIGS. 4A-4B are block diagrams of multi-die packages in accordance with various embodiments.

Referring now to FIG. 4A, shown is a block diagram of a multi-die package in accordance with an embodiment. As shown in FIG. 4A, package 400 includes at least a first die 410 and a second die 450. Understand that dies 410 and 450 may be various types of die including CPUs, accelerators, I/O devices or so forth. In the high level view shown in FIG. 4A, an interconnect 440 that couples the die together is illustrated as a dashed line. Interconnect 440 may be an instantiation of an on-package multi-protocol capable interconnect, e.g., a UCIe interconnect as described herein. While not shown in detail in FIG. 4A, understand that interconnect 440 may be implemented using conductive bumps adapted on each die, which may couple together to provide interconnection between the die. In addition, interconnect 440 further may include in-package circuitry such as conductive lines on or within one or more substrates. As used herein, understand that the term "lanes" refers to any and all interconnect circuitry that couples one die to another die.

In a particular embodiment, interconnect 440 may be a UCIe interconnect having one or more modules, where each module includes a sideband interface and a main band interface. In this high level view, the main band interface couples to main band receiver and transmitter circuitry within each die. Specifically, die 410 includes main band receiver circuitry 420 and main band transmitter circuitry 425, while in turn die 450 includes main band receiver circuitry 465 and main band transmitter circuitry 460.

FIG. 4A further shows connectivity for the sideband interface. In general, a sideband includes a data lane and a clock lane in each direction, and in an advanced package usage, redundancy may be provided with an additional data and clock pair in each direction. Thus FIG. 4A shows a first possible connectivity implementation between the sideband circuitry of the two die. Die 410 includes a sideband circuit 430 including first sideband circuitry 432 that includes corresponding sideband clock and data receivers (R_C and R_D) and sideband clock and data transmitters (T_C and T_D) that couple to corresponding sideband transmitter and receiver circuitry of a sideband circuitry 470 of second die 450, respectively. Sideband circuit 430 also includes second sideband circuitry 434 having similar circuitry for redundant sideband clock and data transmitters and receivers (enumerated as above, with an "R" terminating the transmitter and receiver abbreviations).

In FIG. 4A, a first sideband connectivity instantiation is illustrated, where sideband circuitry 432 and 472 act as a functional sideband, and sideband circuitry 434 and 474 acts as a redundant sideband.

Figure 4B:
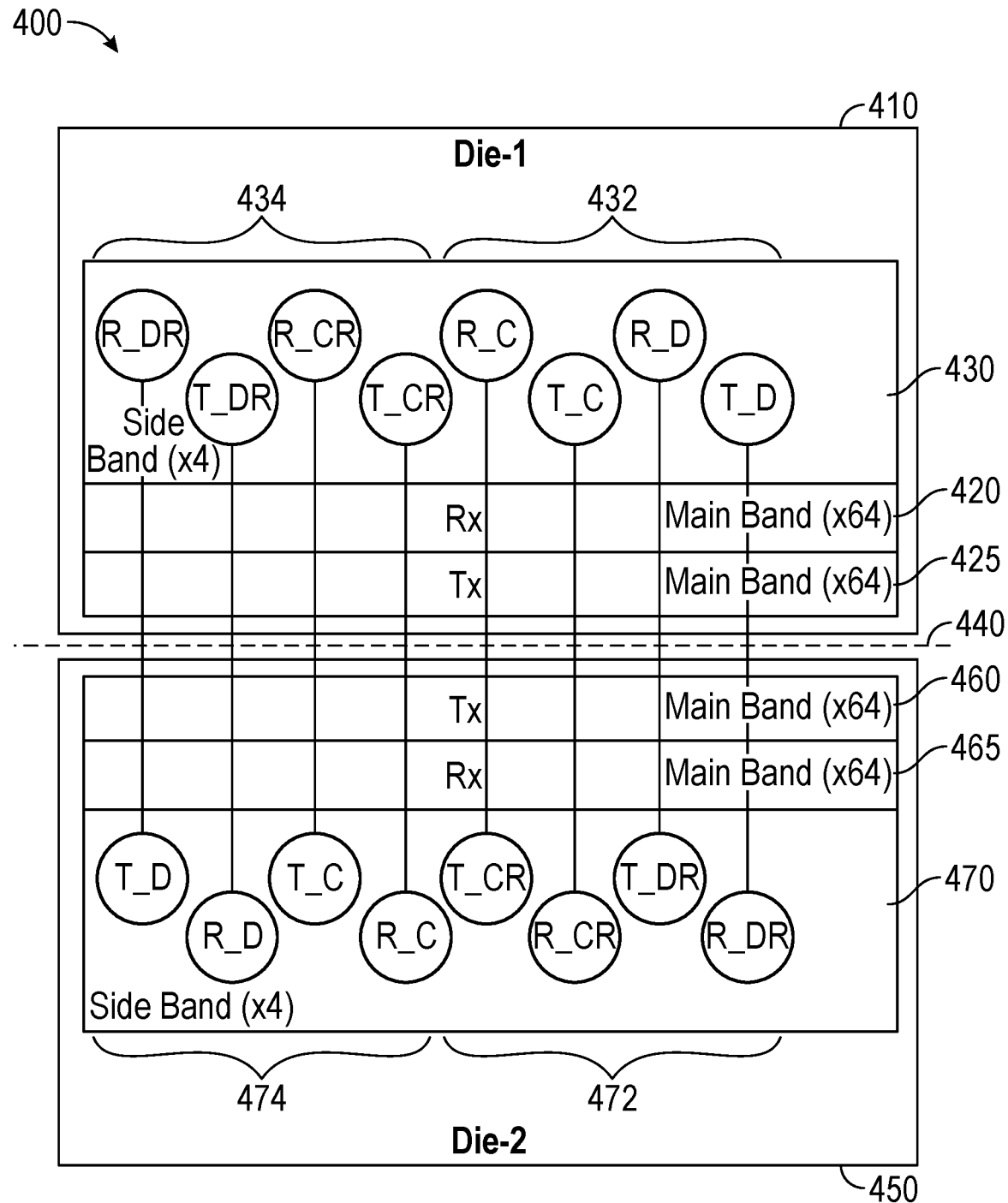

Depending upon a sideband detection that is performed during a sideband initialization, it may be determined that one or more of the sideband lanes and/or associated sideband circuitry is defective and thus at least a portion of redundant sideband circuitry can be used as part of a functional sideband. More specifically FIG. 4B shows a second possible connectivity implementation between the sideband circuitry of the two die. In this example, redundant sideband data transmitter and receiver are present in sideband circuitry 472 to act as part of the functional sideband.

In different implementations, an initialization and bring up flow may allow for any connectivity as long as data-to-data and clock-to-clock connectivity is maintained. If no redundancy is required based on such initialization, both sideband circuit pairs can be used to extend sideband bandwidth, enabling faster message exchanges. Note that while FIGS. 4A and 4B are shown in the context of an advanced package configuration, similar sideband circuitry may be present on die used in a standard package. However in certain implementations, redundant sideband circuitry and redundant sideband lanes may not be present in a standard package, as a standard package may not provide for redundancy and lane repair support.

Figure 5:
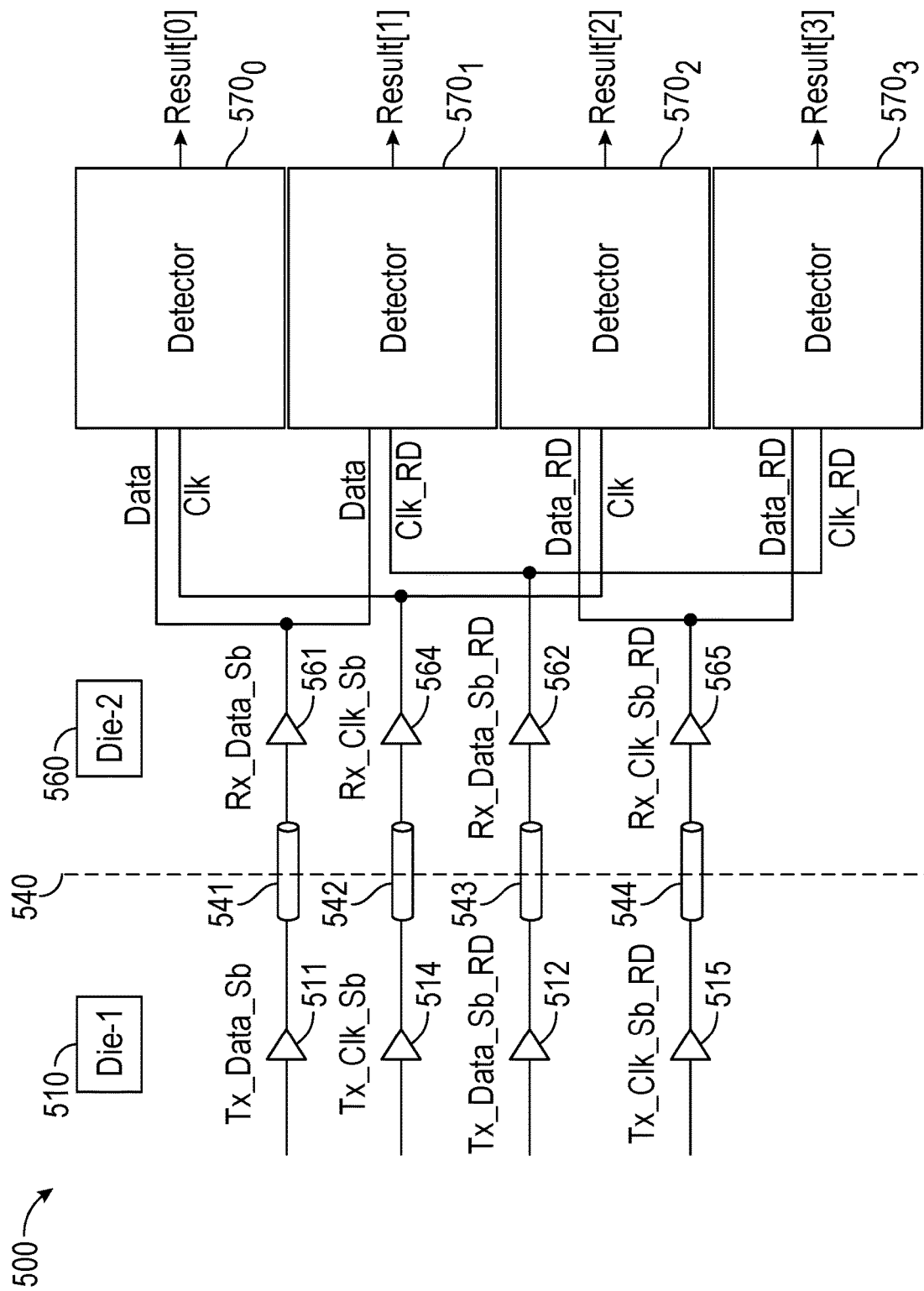
FIG. 5 is a schematic diagram illustrating a die-to-die connection in accordance with an embodiment.

Referring now to FIG. 5, shown is a schematic diagram illustrating a die-to-die connection in accordance with an embodiment. As shown in FIG. 5, a package 500 includes a first die 510 and a second die 560. An interconnect 540, e.g., a UCIe interconnect, includes a plurality of sideband lanes, namely sideband lanes 541-544. Understand while a single direction of sideband lanes is illustrated, corresponding sets of sideband lanes may also be provided for the other direction. First die 510 includes sideband data transmitters and sideband clock transmitters, namely, sideband data transmitters 511, 512 (where sideband data transmitter 512 is a redundant transmitter). First die 510 further includes sideband clock transmitters 514, 515 (where sideband clock transmitter 515 is a redundant transmitter). Second die 560 includes, in turn, sideband data receivers and sideband clock receivers, namely, sideband data receivers 561, 562 (where sideband data receiver 562 is a redundant receiver). Second die 560 further includes sideband clock receivers 564, 565 (where sideband clock receiver 565 is a redundant receiver).

Still referring to FIG. 5, detection circuitry is present in second die 560 that may be used to perform a sideband detection, which may be part of a sideband initialization to determine what lanes are to be included in a functional sideband and what lanes may be part of a redundant sideband. As illustrated, a plurality of detectors $570_{0-3}$ are provided. Each detector 570 receives an incoming sideband data signal and an incoming sideband clock signal such that each detector 570 receives the signals from different combinations of the sideband receivers of second die 560. During sideband initialization, the incoming sideband data signal may be a predetermined sideband initialization packet that includes a predetermined pattern. Detectors 570 may be configured to detect presence of this pattern and generate a first result (e.g., a logic 1) in response to valid detection of the pattern (e.g., for a number of iterations of the pattern) and generate a second result (e.g., a logic 0) in response to no detection of the predetermined pattern. Although embodiments are not limited in this regard, in one implementation detectors 570 may be configured with shift registers, counters and so forth to perform this detection operation and generate the corresponding result by sampling data and redundant data using a clock signal and a redundant clock signal, leading to four combinations.

Table 1 below is an example pseudocode of a sideband assignment or selection process to select the appropriate combination of clock and data lanes to be a functional sideband. In one or more embodiments, if no redundancy is needed, both pairs of sideband lanes can be used to extend sideband bandwidth, enabling faster message exchanges.

TABLE 1

CKSB sampling DATASB = Result[0] # 1: Detected; 0: Not detected
CKSBRD sampling DATASB = Result[1] # 1: Detected; 0: Not detected
CKSB sampling DATASBRD = Result[2] # 1: Detected; 0: Not detected
CKSBRD sampling DATASBRD = Result[3] # 1: Detected; 0: Not detected
IF (Result[3:0] == XXX1): Sideband = (DATASB/CKSB)
ELSE IF (Result[3:0] == XX10): Sideband = (DATASB/CKSBRD)
ELSE IF (Result[3:0] == X100): Sideband = (DATASBRD/CKSB)
ELSE IF (Result[3:0] ==1000): Sideband = (DATASBRD/CKSBRD)
Else: Sideband is not functional Based on the results generated (e.g., Result[0-3] as shown in Table 1), a sideband message, referred to herein as an out of reset sideband message, may be sent that includes a sideband data/clock assignment to indicate which lanes are to be used as a functional sideband (and potentially which lanes can be used as a redundant sideband).

Note that in cases where redundant sideband circuitry is not used for repair purposes, it may be used to increase bandwidth of sideband communications, particularly for data-intensive transfers. As examples, a sideband in accordance with an embodiment may be used to communicate large amounts of information to be downloaded, such as a firmware and/or fuse download. Or the sideband can be used to communicate management information, such as according to a given management protocol. Note that such communications may occur concurrently with other sideband information communications on the functional sideband.

In one embodiment, a sideband initialization (SBINIT) sequence for Advanced Package interface where interconnect repair may be needed is as follows:

1. The UCIe Module starts and continues to send iterations of a 64 UI clock pattern and 32 UI low on both sideband data Transmitters (TXDATASB and TXDATASBRD). The UCIe Module sends strobes on both TXCKSB and TXCKSBRD during active data transmission and gated otherwise.
2. UCIe Module Partner samples each incoming data patterns on its sideband Receivers with both incoming sideband clocks (this forms four Receiver/clock combinations).
3. A sideband data-clock Receiver combination detection is considered successful if two consecutive iterations of pattern in Step 1 are detected.
4. If a UCIe Module Partner detects the pattern successfully on at least one of its sideband data-clock Receiver combinations, it stops sending data and clock on its sideband Transmitters after four more iterations of 64 UI clock pattern and 32 UI low. This will allow for any time differences in both UCIe Module and UCIe Module Partner coming out of RESET state. The sideband Transmitter and Receiver on the UCIe Module are then enabled to send and receive sideband messages.
5. If the pattern is not detected on its sideband Receiver, the UCIe Module continues to send the pattern on its sideband Transmitters for a predetermined duration, e.g., 1 ms and idle for 1 ms for 8 ms. The sideband Receiver of the UCIe Module remains enabled during this time. Timeout occurs after this predetermined duration (e.g., 8 ms) and the UCIe Module enters a TRAINERROR state.
6. If detection is successful on more than one sideband data/clock combination, the device can pick a combination based on a priority order (e.g., in accordance with Table 1).
7. If the sideband on the UCIe Module is enabled to send and receive sideband messages (Step 5), the UCIe Module starts and continues to send a given sideband message (e.g., {SBINIT Out of Reset} sideband message) on both TXDATASB and TXDATASBRD while sending both TXCKSB and TXCKSBRD until it detects the same message in its sideband Receivers or a time out occurs (e.g., at 8 ms).
8. If {SBINIT Out of Reset} sideband message detection is successful on its sideband Receivers, the UCIe Module stops sending the sideband message. Before sending any further sideband messages, both UCIe Module and UCIe Module Partner apply Sideband Data/Clock assignment (called the functional sideband) based on the information included in the {SBINIT Out of Reset} sideband message.
9. Any further sideband messages are sent and received on the functional sideband. Any sideband message exchange can now be performed.
10. The UCIe Module sends the sideband message {SBINIT done req} and waits for a response. If this message is received successfully, UCIe Module Partner responds with {SBINIT done resp}. When a UCIe Module has sent and received {SBINIT done resp} it exits to main band initialization (MBINIT) if sideband message exchange is successful.

In one or more embodiments, a SBINIT sequence for a Standard Package interface where interconnect Lane redundancy and repair are not supported is as follows:

1. The UCIe Module starts and continues to send iterations of 64 UI clock pattern and 32 UI low on its sideband Transmitter (TXDATASB). The UCIe Module sends a strobe on its sideband clock (TXCKSB) during active data duration and gated otherwise
2. The UCIe Module partner samples the incoming data pattern with the incoming clock.
3. Sideband pattern detection is considered successful if two consecutive iterations of the pattern in step 1 are detected.
4. If the UCIe Module detects the pattern successfully, it stops sending data and clock on its sideband Transmitters after four more iterations of the pattern in step 1. This will allow for any time differences in both UCIe Modules coming out of RESET. The UCIe Module sideband Transmitter and Receiver are now be enabled to send and receive sideband messages.
5. If the pattern is not detected on its sideband Receiver, the UCIe Module continues to send the pattern on its Transmitters for a predetermined duration (e.g., 1 ms) and idle for 1 ms for 8 ms. The sideband Receiver is enabled during this time. Timeout occurs after 8 ms and the UCIe Module exits to TRAINERROR. If a pattern is detected successfully at any time, as described in Step 3, the UCIe Module enables sideband message transmission as described in Step 4 and starts sending sideband message (Step 6)
6. Once sideband detection is successful (Step 5), the UCIe Module starts and continues to send {SBINIT Out of Reset} sideband message on TXDATASB while sending TXCKSB until it detects the same message in its sideband Receivers or a timeout occurs.
7. If {SBINIT Out of Reset} sideband message detection is successful, the UCIe module stops sending the message. Any physical layer sideband message exchange can now be performed.
8. The UCIe Module then sends the sideband message {SBINIT done req}. If this message is received successfully, each UCIe Module Partner responds with {SBINIT done resp}. When the UCIe Module has sent and received {SBINIT done resp} it exits to MBINIT The next state is main band initialization (MBINIT) if sideband message exchange is successful.

Referring now to FIG. 6A, shown is a timing diagram illustrating sideband signaling in accordance with an embodiment. As shown in FIG. 6A, timing diagram 600 includes a sideband clock signal 610 and a sideband message signal 620. Sideband message formats may be defined as a 64-bit header with 32 bits or 64 bits of data that are communicated during 64 unit intervals (UIs). Sideband message signal 620 illustrates a 64-bit serial packet. Sideband data may be sent edge aligned with the clock (strobe) signal. A receiver of a sideband interface samples the incoming data with the strobe. For example, the negative edge of the strobe can be used to sample the data as the data uses SDR signaling.

Referring now to FIG. 6B, shown is a timing diagram illustrating sideband packet back-to-back transmission in accordance with an embodiment. As shown in FIG. 6B, timing diagram 601 illustrates communication of a first sideband packet 622 followed by a second sideband packet 624. As shown, each packet may be a 64 bit serial packet that is sent during a 64 UI duration. More specifically, first sideband packet 622 is sent that in turn is followed by a 32 UI duration of logic low on both clock and data lanes, after which second sideband packet 624 is communicated. In embodiments, such signaling may be used for various sideband communications, including sideband messages during a sideband initialization.

Figure 7:
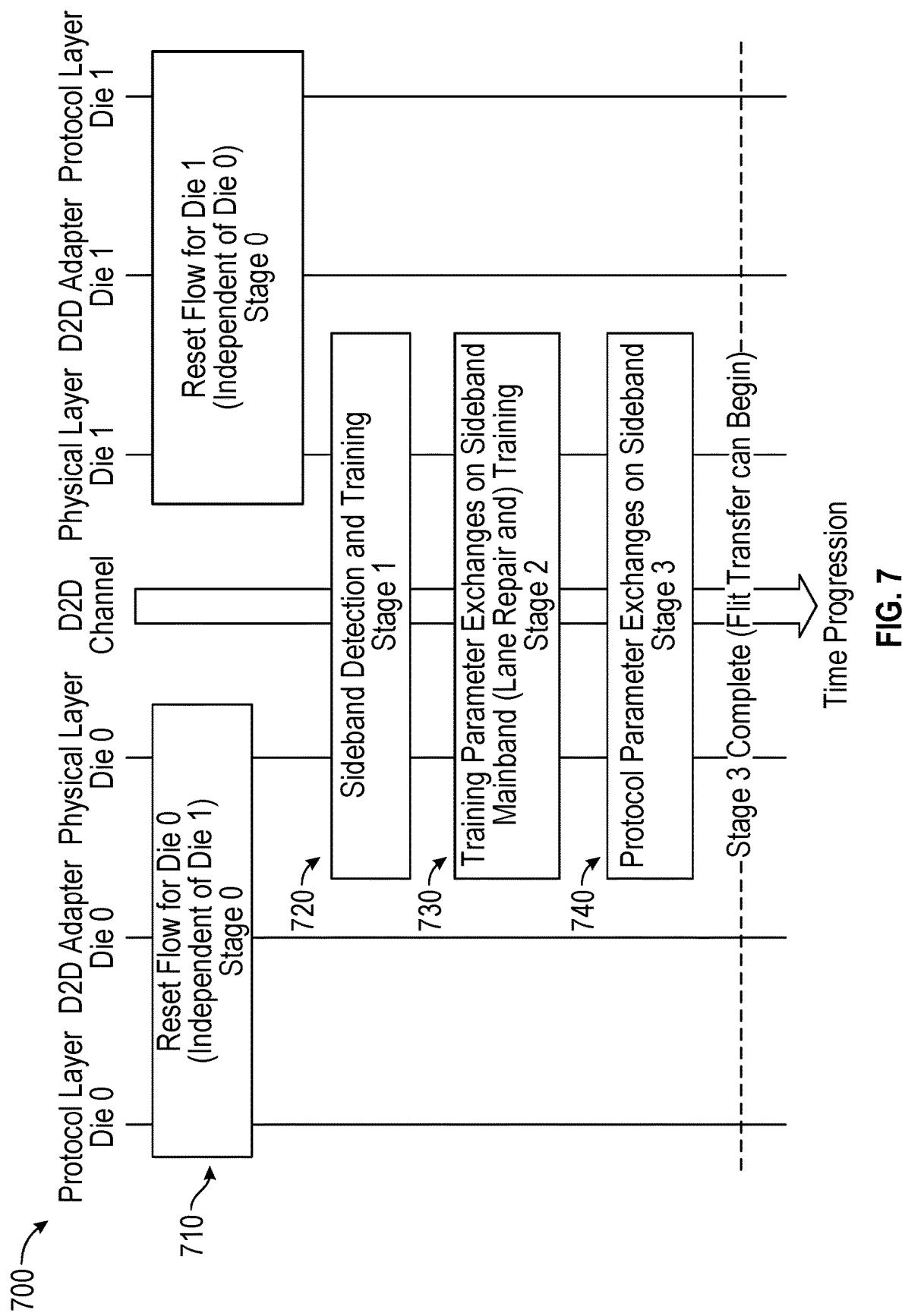
FIG. 7 is a flow diagram illustrating a bring up flow for an on-package multi-protocol capable interconnect in accordance with an embodiment.

Referring now to FIG. 7, shown is a flow diagram illustrating a bring up flow for an on-package multi-protocol capable interconnect in accordance with an embodiment. As shown in FIG. 7, a bring up flow 700 begins by independently performing reset flows on two dies (dies 0 and 1) that are coupled together via, e.g., a UCIe interconnect (illustrated in FIG. 7 as a D2D channel). Thus, a first die (die 0) performs an independent reset flow at stage 710, and a second die (die 1) also performs an independent reset flow at stage 710. Note that each die may exit its reset flow at different times. Next at stage 720 a sideband detection and training may be performed. In stage 720 the sideband may be detected and trained. In the case of an advanced package where lane redundancy is available, available lanes may be detected and used for sideband messages. Note that this sideband detection and training, which includes a sideband initialization as described herein, may be used to detect presence of activity in a coupled die, since as discussed above, each die may exit a reset flow at a different time. In one or more embodiments, a trigger for exiting out of reset and initiating link training is detection of a sideband message pattern. When training during link bring up as when a physical layer transitions out of a reset state, hardware is permitted to attempt training multiple times. During this bring up operation, synchronization may occur as every state and substate entry and exit for both dies is ensured to be in lockstep by a 4-way sideband message handshake between the dies.

At stage 730, training parameter exchanges may be performed on the functional sideband, and a main band training occurs. In stage 730, the main band is initialized, repaired and trained. Finally at stage 740, protocol parameter exchanges may occur on the sideband. In stage 740, the overall link may be initialized by determining local die capabilities, parameter exchanges with the remote die and a bring up of a FDI that couples a corresponding protocol layer with a D2D adapter of the die. In an embodiment, the mainband, by default, initializes at the lowest allowed data rate in the mainband initialization, where repair and reversal detection are performed. The link speed then transitions to a highest common data rate that is detected through the parameter exchange. After link initialization, the physical layer may be enabled to performed protocol flit transfers via the mainband.

In one or more embodiments, different types of packets may be communicated via a sideband interface, and may include: (1) register accesses, which can be Configuration (CFG) or Memory Mapped Reads or Writes and can be 32-bit or 64-bits (b); (2) messages without data, which can be Link Management (LM), or Vendor Defined Packets, and which do not carry additional data payloads; (3) messages with data, which can be Parameter Exchange (PE), Link Training related or Vendor Defined, and carry 64b of data. Packets may carry a 5-bit opcode, 3-bit source identifier (srcid), and a 3-bit destination identifier (dstid). The 5-bit opcode indicates the packet type, as well as whether it carries 32b of data or 64b of data. Table 2 below gives the mapping of opcode encodings to Packet Types in accordance with an embodiment.

TABLE 2

Opcode encodings mapped to Packet Types

| Opcode Encoding | Packet Type |
| --- | --- |
| 00000b | 32 b Memory Read |
| 00001b | 32 b Memory Write |
| 00100b | 32 b Configuration Read |
| 00101b | 32 b Configuration Write |
| 01000b | 64 b Memory Read |
| 01001b | 64 b Memory Write |
| 10000b | Completion without Data |
| 10001b | Completion with 32 b Data |
| 11001b | Completion with 64 b Data |
| 10010b | Message without Data |
| 11011b | Message with 64 b Data |
| Other encodings | Reserved |

The Source/Destination Identifier (srcid/dstid) encodings depicted in Table 3 below may give the encodings of source and destination identifiers. It may not be permitted for a protocol layer from one side of the link to directly access the protocol layer of the remote link partner (such communication may be via the main band). In an embodiment, it may be the responsibility of the message originator to make sure it sets the correct encodings in srcid/dstid. For example, if the D2D adapter is sending a message to its remote link partner, it may set the srcid as remote D2D adapter, and it may set the dstid as remote D2D adapter. Hence, there may not be a case possible where srcid is "Local" but dstid is "Remote".

TABLE 3

Source/Destination Identifier encodings

| srcid/dstid | Entity |
| --- | --- |
| 3'b000 | Stack 0 Protocol Layer (only for Local messages) |
| 3'b001 | Local D2D Adapter (only for Local messages) |
| 3'b010 | Local Physical Layer (only for Local messages) |
| 3'b100 | Stack 1 Protocol Layer (only for Local messages) |
| 3'b101 | Remote D2D Adapter (only for Remote messages) |
| 3'b110 | Remote Physical Layer (only for Remote messages) |

As discussed above, one type of sideband packet is for a register access request. As shown in Table 4, field descriptions for Register Access Requests may give the description of the fields other than the opcode, srcid and dstid, and Table 5 shows address field mappings for different requests.

TABLE 4

Field descriptions for Register Access Requests

| Field | Description |
| --- | --- |
| CP | Control Parity (CP) is the even parity of all the header bits excluding DP. |
| DP | Data Parity is the even parity of all bits in the data payload. If there is no data payload, this bit is set to 0 b. |

TABLE 4-continued

Field descriptions for Register Access Requests

| Field | Description |
| --- | --- |
| Ak | Acknowledge for received requests that have passed CP and DP checks. Refer to Flow Control and Data Integrity for details. |
| Addr[26:0] | Address of the request. Different opcodes use this field differently. See Mapping of Addr field for different requests for details. The following rules apply for the address field: For 64-bit request, Addr[2:0] is reserved. For 32-bit request, Addr[1:0] is reserved. |
| BE[7:0] | Byte Enables for the Request. It is NOT required to be contiguous. BE[7:4] are reserved if the opcode is for a 32-bit request. |
| EP | Data Poison. If poison forwarding is enabled, the completer can poison the data on internal errors. |
| Tag[4:0] | Tag is a 5-bit field generated by the requester, and it must be unique for all outstanding requests that require a completion. |
| Data | Payload. Can be 32 bits or 64 bits wide depending on the Opcode. |

TABLE 5

Mapping of Addr field (e.g., of Table 6) for different requests

| Opcode | Description |
| --- | --- |
| Memory Reads/Writes | {dstid[2:0], Offset[23:0]}, where dstid[2:0]encodingsare given in Source/Destination Identifier encodings, and Offset is the Byte Offset |
| Configuration Reads/Writes | {dstid[2:0], Dev[4:0], Func[2:0], Rsvd[3:0], Byte Offset[11:0]}, where dstid[2:0] encodings are given in Source/Destination Identifier encodings Dev is the Device ID Func is the Function |

Another type of sideband packet is a register access completion. The field descriptions for a completion of Table 6 provide example field descriptions for a completion.

TABLE 6

Field Descriptions for a completion

| Field | Description |
| --- | --- |
| Tag[4:0] | Completion Tag associated with the corresponding Request |
| CP | Control Parity. All fields other than "DP" and "CP" in the Header are protected by Control Parity, and the parity scheme is even (including reserved bits) |
| DP | Data Parity. All fields in data are protected by data parity, and the parity scheme is even. |
| Ak | Acknowledge for received requests that have passed CP and DP checks. Refer to Flow Control and Data Integrity for details. |

TABLE 6-continued

Field Descriptions for a completion

| Field | Description |
| --- | --- |
| EP | Data Poison. If poison forwarding is enabled, the completer can poison the data on internal errors. |
| BE[7:0] | Byte Enables for the Request. Completer returns the same value that the original request had (this avoids the requester from having to save off the BE value). BE[7:4] are reserved if the opcode is for a 32-bit request. |
| Status[2:0] | Completion Status 000b - Successful Completion (SC) 001b - Unsupported Request (UR) 010b - Configuration Request Retry Status (CRS) 100b - Completer Abort (CA) Other encodings are reserved. |
| Data | Payload. 32 bits or 64 bits depending on the Opcode. |

Another sideband packet type is a message without data payload. Such messages may be, e.g., Link Management packets, Parameter Exchange packets, NOPs or Vendor Defined message packets. The 16-bit MsgInfo may be 0000h for Link Management packets and NOPs. It may be Vendor Defined for Vendor Defined messages. For Parameter Exchange packets, it may carry with it the Capability information for Advertised Parameters, or the Finalized Configuration Parameters after negotiation.

The definitions of opcode, srcid, dstid, dp, cp and ak fields may be the same as register access packets. Various encodings may be as shown in Tables 7 or 8.

TABLE 7

Msgcode and MsgSubcode encodings

| Msgcode | Description | MsgSubCode | Description |
| --- | --- | --- | --- |
| 00h | NOP | 01h | Acknowledge for single request |
| | | 02h | Acknowledge for two requests |
| 01h | Parameter Exchange for D2D Adapter | 00h | Advertised Capability for D2D Adapter |
| | | 01h | Advertised Capability for CXL |
| | | 10h | Finalized Capability for D2D Adapter |
| | | 11h | Finalized Capability for CXL |
| 02h | Link Management Request for RDI (i.e Physical Layer packet) | 00h | Active |
| | | 01h | PM |
| | | 03h | Retrain |
| | | 04h | LinkError |
| 03h | Link Management Status for RDI (i.e. Physical Layer packet) | 00h | Active |
| | | 01h | PM |
| | | 03h | Retrain |
| | | 04h | LinkError |
| | | 06h | PMNAK |
| 04h | Link Management Request for FDI (i.e. Adapter packet) | 00h | Active |
| | | 01h | L1.1 |
| | | 02h | L2 |
| | | 03h | Retrain |
| | | 04h | LinkError |
| | | 05h | LinkReset |

TABLE 7-continued

Msgcode and MsgSubcode encodings

| Msgcode | Description | MsgSubCode | Description |
|---|---|---|---|
| 05h | Link Management Status for FDI (i.e. Adapter packet) | 00h | Active |
| | | 01h | L1.1 |
| | | 02h | L2 |
| | | 03h | Retrain |
| | | 04h | LinkError |
| | | 05h | LinkReset |
| | | 06h | PMNAK |
| FFh | Vendor Defined Message. MsgSubcode and Msginfo descriptions are vendor defined. | | |
| Other Encodings | Reserved | | |

TABLE 8

MsgInfo bits for D2D Adapter Capability (Advertised or Finalized)

| Bit | Description |
|---|---|
| 0 | Raw_Mode |
| 1 | Optimized_Mode_Three_Lanes |
| 2 | Optimized_Mode_Two_Lanes |
| 3 | CXL |
| 4 | PCIe |
| 5 | Retry |
| 6 | Two_Protocol_Stacks |
| 7 | Parity |
| 8 | Streaming |
| [15:9] | Reserved |

Messages with data payloads may include opcode, srcid, dstid, dp, cp and ak fields the same as register access packets.

Flow control and data integrity sideband packets can be transferred across FDI, RDI or the UCIe sideband link. Each of these have independent flow control. For each transmitter associated with FDI or RDI, a design time parameter of the interface can be used to determine the number of credits advertised by the receiver, with a maximum of 32 credits. Each credit corresponds to 64 bits of header and 64 bits of potentially associated data. Thus, there is only one type of credit for all sideband packets, regardless of how much data they carry. Every transmitter/receiver pair has an independent credit loop. For example, on RDI, credits are advertised from physical layer to adapter for sideband packets transmitted from the adapter to the physical layer; and credits are also advertised from adapter to the physical layer for sideband packets transmitted from the physical layer to the adapter. The transmitter checks for available credits before sending register access requests and messages. The transmitter does not check for credits before sending register access completions, and the receiver guarantees unconditional sinking for any register access completion packets. Messages carrying requests or responses consume a credit on FDI and RDI, but they are guaranteed to make forward progress by the receiver and not be blocked behind register access requests. Both RDI and FDI give a dedicated signal for sideband credit returns across those interfaces. All receivers associated with RDI and FDI check received messages for data or control parity errors, and these errors are mapped to Uncorrectable Internal Errors (UIE) and transition the RDI to the LinkError state.

Figure 8:
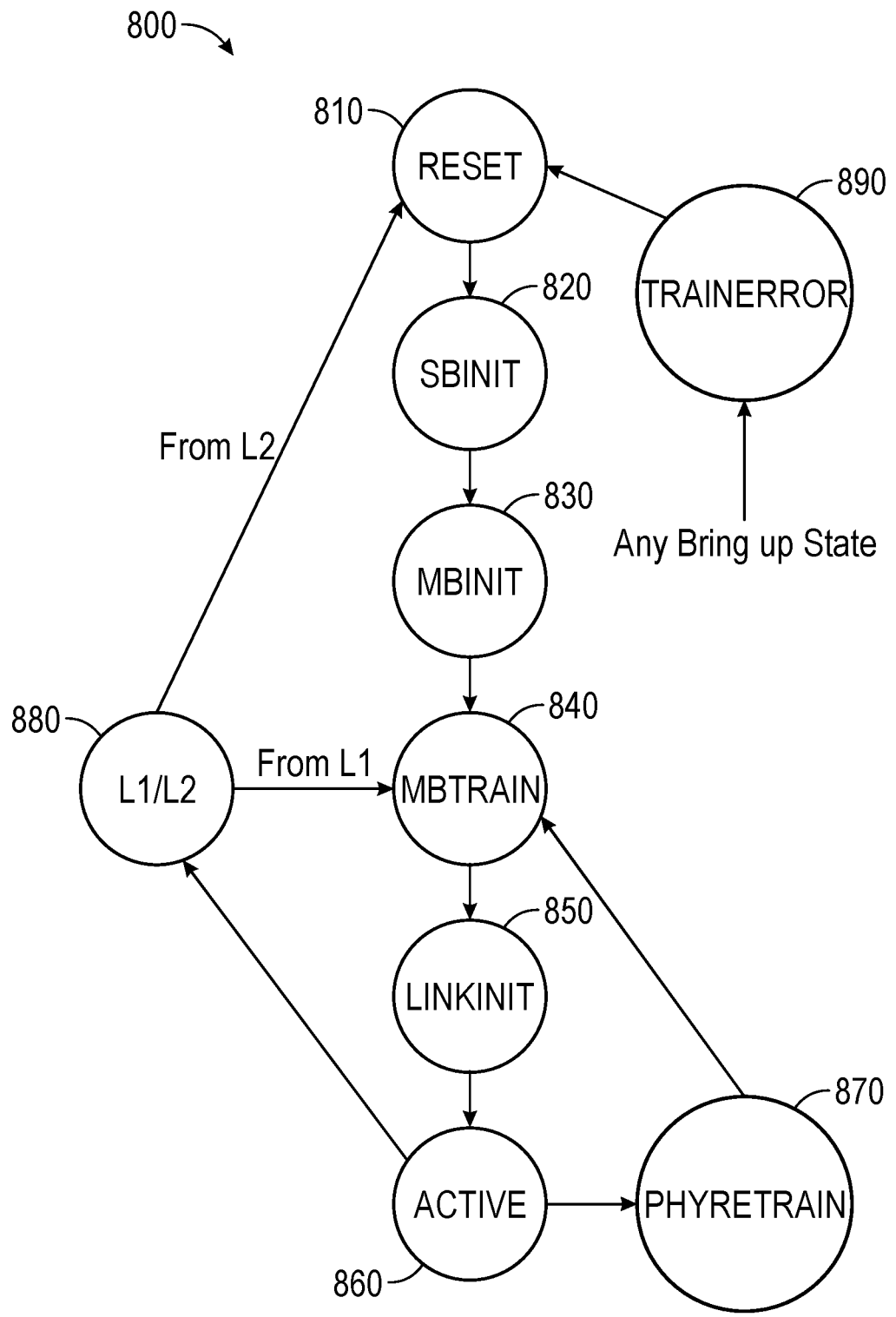
FIG. 8 is a flow diagram of a link training state machine in accordance with an embodiment.

Referring now to FIG. 8, shown is a flow diagram of a link training state machine in accordance with an embodiment. As shown in FIG. 8, method 800 is an example of a link initialization performed, e.g., by logical physical layer circuitry, which may include the link state machine. Table 9 is a high level description of the states of a link training state machine in accordance with an embodiment, and the details and actions performed in each state are described below.

TABLE 9

| STATE | DESCRIPTION |
|---|---|
| RESET | This is the state following primary reset or exit from TRAINERROR |
| SBINIT | Side band initialization state where the side band is detected, repaired (when applicable) and out of reset message is transmitted |
| MBINIT | Following sideband initialization, Main band (MB) is initialized at the lowest speed. Both dies perform on die calibration followed by interconnect repair (when applicable) |
| MBTRAIN | Main band (Data, Clock and Valid signals) speed of operation is set to the highest negotiated data rate. Die-to-Die training of main band is performed to center the clock with respect to Data. |
| LINKINIT | This state is used to exchange Adapter and Link management messages |
| ACTIVE | This is the state in which transactions are sent and received |
| PHYRETRAIN | This state is used to begin the retrain flow for the Link during runtime |
| TRAINERROR | State is entered when a fatal or non-fatal event occurs at any point during Link Training or operation. |

With reference to FIG. 8, method 800 begins in a reset state 810. In an embodiment, a PHY stays in the reset state for a predetermined minimum duration (e.g., 4 ms) to allow various circuitry including phase lock loops (PLLs) to stabilize. This state may be exited when power supplies are stable, a sideband clock is available and running, main band and die-to-die adapter clocks are stable and available, a main band clock is set to a slowest 10 data rate (e.g., 2 GHz for 4 GT/s), and a link training trigger has occurred. Next control passes to a sideband initialization (SBINIT) state 820, where sideband initialization may be performed. In this state, the sideband interface is initialized and repaired (when applicable). During this state, mainband transmitters may be tri-stated and mainband receivers are permitted to be disabled.

Still with reference to FIG. 8, from sideband initialization state 820, control passes to a main band initialization (MBINIT) state 830 in which a main band initialization is performed. In this state, the main band interface is initialized and repaired or degraded (when applicable). The data rate on the main band may be set to a lowest supported data rate (e.g., 4 GT/s). For an advanced package, interface interconnect repair may be performed. Sub-states in MBINIT allow detection and repair of data, clock, track and valid lanes. For a standard package interface where no lane repair is needed, sub-states are used to check functionality at a lowest data rate and perform width degrade if needed.

Next at block 840, a main band training (MBTRAIN) state 840 is entered in which main band link training may be performed. In this state, operational speed is set up and clock to data centering is performed. At higher speeds, additional calibrations like receiver clock correction, transmit and receive de-skew may be performed in sub-states to ensure link performance. Modules enter each sub-state and exit of each state is through a sideband handshake. If a particular action within a sub-state is not needed, the UCIe Module is permitted to exit it though the sideband handshake without performing the operations of that sub-state. This state may be common for advanced and standard package interfaces, in one or more embodiments.

Control then proceeds to block 850 where a link initialization (LINKINIT) state occurs in which link initialization may be performed. In this state, a die-to-die adapter completes initial link management before entering an active state on a RDI. Once the RDI is in the active state, the PHY clears its copy of a "Start UCIe link training" bit from a link control register. In embodiments, a linear feedback shift register (LFSR) is reset upon entering this state. This state may be common for advanced and standard package interfaces, in one or more embodiments.

Finally, control passes to an active state 860, where communications may occur in normal operation. More specifically, packets from upper layers can be exchanged between the two dies. In one or more embodiments, all data in this state may be scrambled using a scrambler LFSR.

Still with reference to FIG. 8, note that during active state 860 a transition may occur either to a retrain (PHYRETRAIN) state 870 or a low power (L2/L1) link state 880 may occur. As seen, depending upon the level of the low power link state, exit may proceed either to main band training state 840 or reset state 810. In the low power link states, lower power is consumed than dynamic clock gating in an ACTIVE state. This state may be entered when an RDI has transitioned to a power management state. When a local adapter requests an active on the RDI or a remote link partner requests L1 exit, the PHY exits to the MBTRAIN-.SPEEDIDLE state. In one or more embodiments, L1 exit is coordinated with the corresponding L1 state exit transitions on the RDI. When the local adapter requests the active state on RDI or the remote link partner requests L2 exit, the PHY exits to the RESET state. Note that L2 exit may be coordinated with the corresponding L2 state exit transitions on the RDI.

As further shown in FIG. 8, should an error occur during any of the bring up states, control passes to block 890 where a train error state may occur. This state is used as a transitional state due to any fatal or non-fatal events to bring the state machine back to the RESET state. If the sideband is active, a sideband handshake is performed for the link partners to enter TRAINERROR state from any state other than SBINIT.

In an embodiment, a die can enter the PHYRETRAIN state for a number of reasons. The trigger may be by an adapter-directed PHY retrain or a PHY-initiated PHY retrain. A local PHY initiates a retrain on detecting a Valid framing error. A remote die may request PHY retrain, which causes a local PHY to enter PHY retrain on receiving this request. This retrain state also may be entered if a change is detected in a Runtime Link Testing Control register during MBTRAIN.LINKSPEED state. Understand while shown at this high level in the embodiment of FIG. 8, many variations and alternatives are possible.

Figure 9:
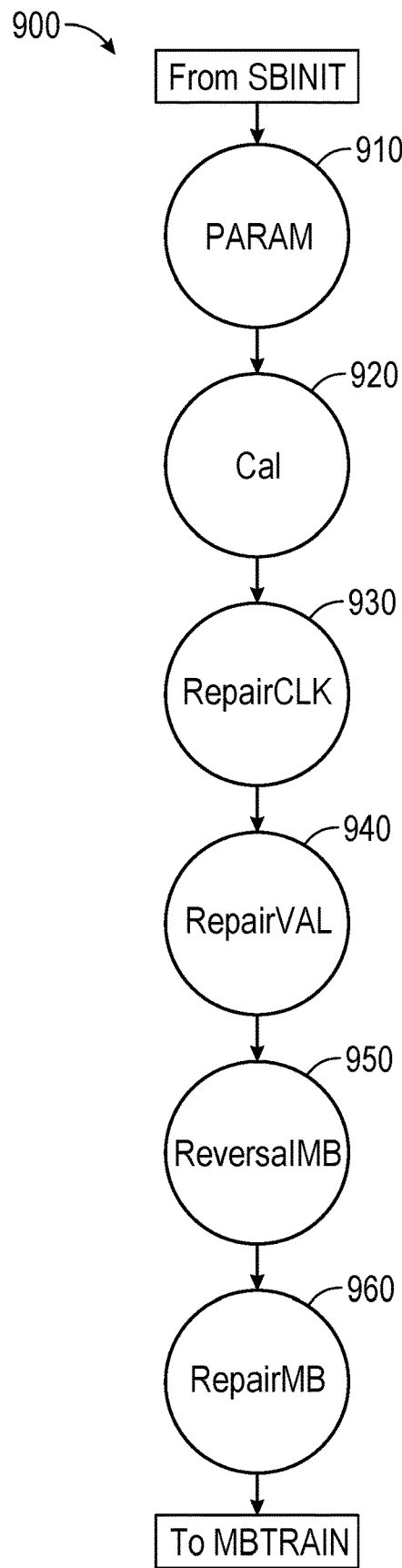
FIG. 9 is a flow diagram of further details of a main band initialization in accordance with an embodiment.

Referring now to FIG. 9, shown is a flow diagram of further details of a main band initialization in accordance with an embodiment. Method 900 may be implemented by the link state machine to perform main band initialization. As shown, this initialization proceeds through a plurality of states, including a parameter exchange state 910, a calibration state 920, a repair clock state 930, a repair validation state 940, a reversal main band state 950, and finally a main band repair state 960. After completion of this main band initialization, control proceeds to main band training.

In parameter exchange state 910, an exchange of parameters may occur to setup the maximum negotiated speed and other PHY settings. In an embodiment, the following parameters may be exchanged with a link partner (e.g., on a per Module basis): voltage swing; maximum data rate; clock mode (e.g., strobe or continuous clock); clock phase; and Module ID. In state 920, any calibration needed (e.g., transmit duty cycle correction, receiver offset and Vref calibration) may be performed.

Next at block 930, detection and repair (if needed) to clock and track Lanes for Advanced Package interface and for functional check of clock and track Lanes for Standard Package interface can occur. At block 940, A Module may set the clock phase at the center of the data UI on its mainband transmitter. The Module partner samples the received Valid with the received forwarded clock. All data lanes can be held at low during this state. This state can be used to detect and apply repair (if needed) to Valid Lane.

Still referring to FIG. 9, block 950 is entered only if clock and valid lanes are functional. In this state, data lane reversal is detected. All transmitters and receivers of a Module are enabled. The Module sets the forwarded clock phase at the center of the data UI on its mainband. The Module partner samples the incoming data with the incoming forwarded clock. A 16-bit "Per Lane ID" pattern (unscrambled), shown in Table 10 is a lane specific pattern using a Lane ID for the corresponding lane. Table 11 shows examples of "Per Lane ID" pattern for Lane 0 and Lane 31.

TABLE 10

Per Lane ID pattern

| | | | | | Pattern | | | | | | | | | | |
|---|---|---|---|---|---|---|---|---|---|---|---|---|---|---|---|
| | 0 | 1 | 0 | 1 | | Lane ID (LSB first) | | | | | | 0 | 1 | 0 | 1 |
| Bit | 0 | 1 | 2 | 3 | 4 | 5 | 6 | 7 | 8 | 9 | 10 | 11 | 12 | 13 | 14 | 15 |

TABLE 11

Per Lane ID pattern examples

| | | | | | | | | | | | | | | | | |
|---|---|---|---|---|---|---|---|---|---|---|---|---|---|---|---|---|
| Lane 1 | 0 | 1 | 0 | 1 | 1 | 0 | 0 | 0 | 0 | 0 | 0 | 0 | 0 | 1 | 0 | 1 |
| Lane 31 | 0 | 1 | 0 | 1 | 1 | 1 | 1 | 1 | 1 | 0 | 0 | 0 | 0 | 1 | 0 | 1 |
| bit | 0 | 1 | 2 | 3 | 4 | 5 | 6 | 7 | 8 | 9 | 10 | 11 | 12 | 13 | 14 | 15 |

In an embodiment, a reversal mainband sequence for Advanced Package interface and Standard Package interface is as follows:
1. The Module sends a sideband message {MBINIT.REVERSALMB init req}. When ready to receive "Per Lane ID" pattern and perform per Lane pattern comparison, the Module partner responds with {MBINIT.REVERSALMB init resp}.
2. On Receiving the {MBINIT.REVERSALMB init resp} sideband message, the Module sends {MBINIT.REVERSALMB clear error req} sideband message. Upon receiving this message, the Module partner clears any prior errors and responds with {MBINIT.REVERSALMB clear error resp}. After receiving {MBINIT.REVERSALMB clear error resp}, the Module sends 128 iterations of Per Lane ID pattern (LSB first) on all N data lanes with correct valid framing on the Valid lane along with the forwarded clock. N is 68 (64 Data+4 RD) for advanced package interface and 16 for standard package Interface.
3. The Module partner performs a per lane compare on its receivers on all N lanes. Detection on a lane is considered successful if at least 16 consecutive iterations of "Per Lane ID" pattern are detected. The Module partner logs the detection result for its receive lanes to be used for lane reversal detection.
4. After sending 128 iterations of "Per Lane ID" pattern, the Module stops sending the pattern and sends {MBINIT.REVERSALMB result req} sideband message to get the logged result.
5. The Module partner stops comparison and responds with {MBINIT.REVERSALMB result resp} sideband message with N-bit (68 for Advanced and 16 for Standard Package interface) per lane result.
6. If a majority of the lanes show success (since some lanes may need repair), lane reversal is not needed, and step 11 occurs.
7. Otherwise if the results from step 5 show a majority of lanes are unsuccessful, the Module applies lane reversal on its transmitters.
8. Following the lane reversal application on its transmitters, the module repeats steps 2-5.
9. If a majority of lanes show success, lane reversal is needed. If applied, lane Reversal is preserved for the rest of device operation, and step 11 occurs.
10. Otherwise if the results from step 8 show a majority of the lanes are unsuccessful, the Module exits to the TRAINERROR state after completing a TRAINERROR handshake.
11. The Module sends a {MBINIT.ReversalMB done req} sideband message and the Module partner responds with {MBINIT.RversalMB done resp}. When the Module has sent and received {MBINIT.ReversalMB done resp} sideband message, it proceeds to the next mainband initialization state (e.g., REPAIRMB state 960).

Still referring to FIG. 9, at block 960, which is entered only after lane reversal detection and application is successful, all the transmitters and receivers of a Module are enabled. The Module sets the clock phase at the center of the data UI for its mainband. The Module partner samples the incoming data with the incoming forwarded clock on its mainband receivers. In this state, the main band lanes are detected and repaired if needed for Advanced Package interface and for functional check and width degrade for Standard Package interface. Stated another way, if an error is detected in a lane, redundant circuitry can be enabled via a redundant lane.

In example embodiments, several degrade techniques may be used to enable a link to find operational settings, during bring up and operation. First a speed degrade may occur when an error is detected (during initial bring up or functional operation) and repair is not required. Such speed degrade mechanism may cause the link to go to a next lower allowed frequency; this is repeated until a stable link is established. Second a width degrade may occur if repair is not possible (in case of a standard package link where there are no repair resources), the width may be allowed to degrade to a half width configuration, as an example. For example, a 16 lane interface can be configured to operate as an 8 lane interface.

Figure 10:
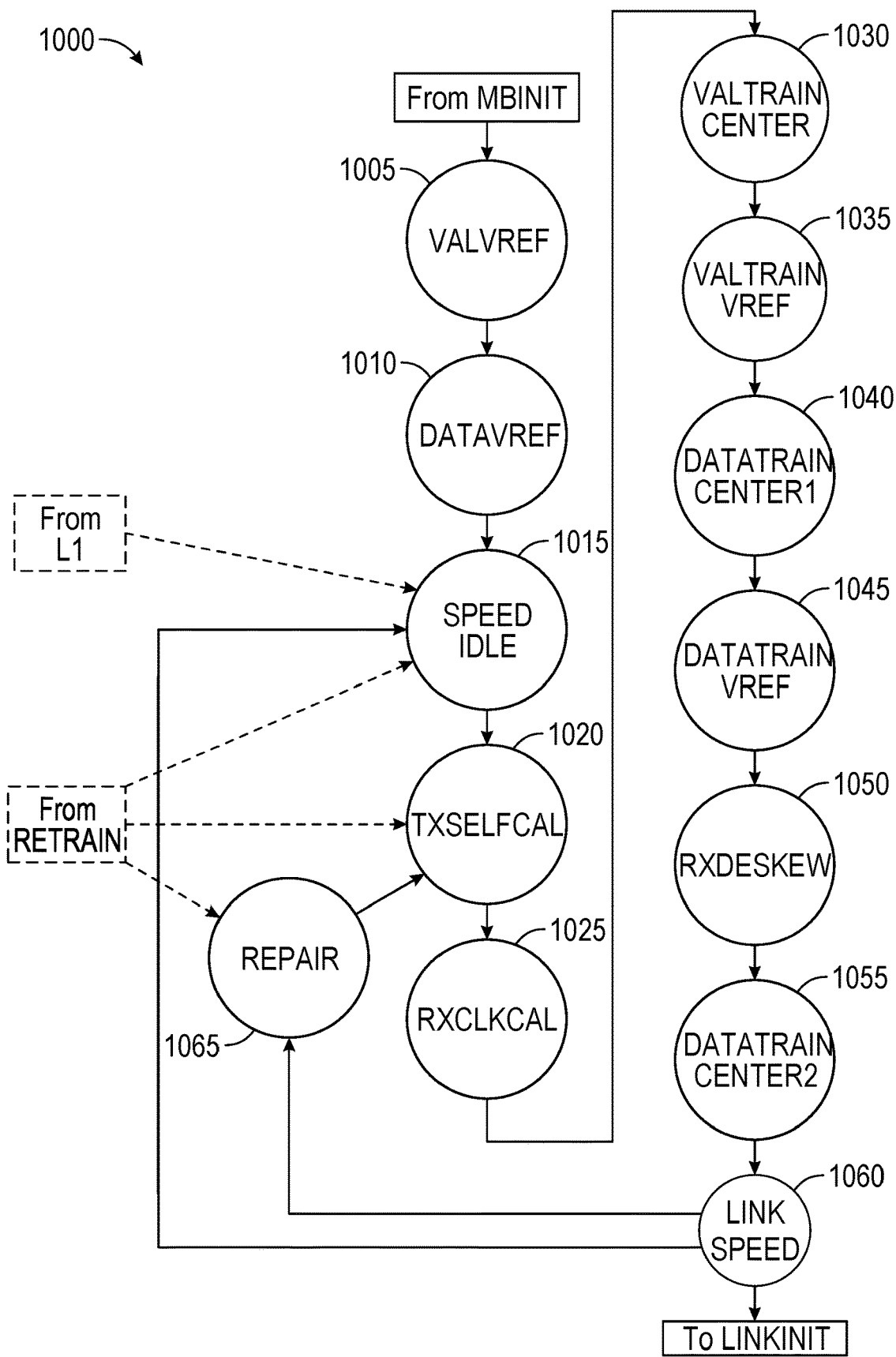
FIG. 10 is a flow diagram of a main band training in accordance with an embodiment.

Referring now to FIG. 10, shown is a flow diagram of a main band training in accordance with an embodiment. As shown in FIG. 10, method 1000 may be implemented by the link state machine to perform main band training. In main band training, the main band data rate is set to the highest common data rate for the two connected devices. Data to clock training, deskew and Vref training may be performed using multiple sub states. As shown in FIG. 10, main band training proceeds through a plurality of states or sub-states. As illustrated, main band training begins by performing valid reference voltage training state 1005. In state 1005, a receiver reference voltage (Vref) to sample the incoming Valid is optimized. The data rate on the main band continues to be at the lowest supported data rate. The Module partner sets the forwarded clock phase to the center of the data UI on its main band transmitters. The receiver Module samples the pattern on the Valid signal with the forwarded clock. All data lanes are held low during Valid lane reference voltage training. Control next proceeds to a data reference voltage state 1010, where a receiver reference voltage (Vref) to sample the incoming data is optimized, while the data rate continues to be at the lowest supported data rate (e.g., 4 GT/s). The transmitter sets the forwarded clock phase at the center of the data UI. Thereafter, an idle speed state 1015 occurs where a frequency change may be allowed in this electrical idle state; more specifically, the data rate may be set to the maximum common data rate decided in the previous state. Thereafter, circuit parameters may be updated in transmitter and receiver calibration states (1020 and 1025).

Still referring to FIG. 10, various training states 1030, 1035, 1040 and 1045 may proceed to respectively train valid-to-clock training reference voltage level, full data-to-clock training, and data receiver reference voltages. In state 1030, to ensure the valid signal is functional, valid-to-clock training is performed before data lane training. The receiver samples the pattern on valid with the forwarded clock. In state 1035, the Module may optimize the reference voltage (Vref) to sample the incoming valid at the operating data rate. In state 1040, the Module performs full data to clock training (including valid) using LFSR patterns. In state 1045, the Module may optimize the reference voltage (Vref) on its data receivers to optimize sampling of the incoming data at the operating data rate.

Still with reference to FIG. 10, thereafter a receiver deskew state 1050 may occur, which is a receiver-initiated training step for the receiver to perform lane-to-lane deskew, to improve timing margin. Next another data training state 1055 occurs in which the Module may re-center the clock to aggregate data in case the Module partner's receiver performed a per lane deskew. Control next passes to a link speed state 1060, where link stability at the operating data rate may be checked after the final sampling point is set in state 1055. If the link performance is not met at the data rate, speed is degraded to a next lower supported data rate and training is performed again. Depending upon the result of such state, main band training may conclude, with control next passing to a link initialization. Otherwise, either a link speed change at state 1015 or a repair state 1065 may occur. Note that entry into states 1015 and 1065 also may occur from a low power state (e.g., a L1 link power state) or a retraining state. Understand while shown at this high level in the embodiment of FIG. 10, many variations and alternatives are possible.

Embodiments may support two broad usage models. The first is package level integration to deliver power-efficient and cost-effective performance. Components attached at the board level such as memory, accelerators, networking devices, modem, etc. can be integrated at the package level with applicability from hand-held to high-end servers. In such use cases dies from potentially multiple sources may be connected through different packaging options, even on the same package.

The second usage is to provide off-package connectivity using different type of media (e.g., optical, electrical cable, millimeter wave) using UCIe retimers to transport the underlying protocols (e.g., PCIe, CXL) at the rack or pod level for enabling resource pooling, resource sharing, and/or message passing using load-store semantics beyond the node level to the rack/pod level to derive better power-efficient and cost-effective performance at the edge and data centers.

As discussed above, embodiments may be implemented in datacenter use cases, such as in connection with racks or pods. As an example, multiple compute nodes from different compute chassis may connect to a CXL switch. In turn, the CXL switch may connect to multiple CXL accelerators/Type-3 memory devices, which can be placed in one or more separate drawers.

Figure 11:
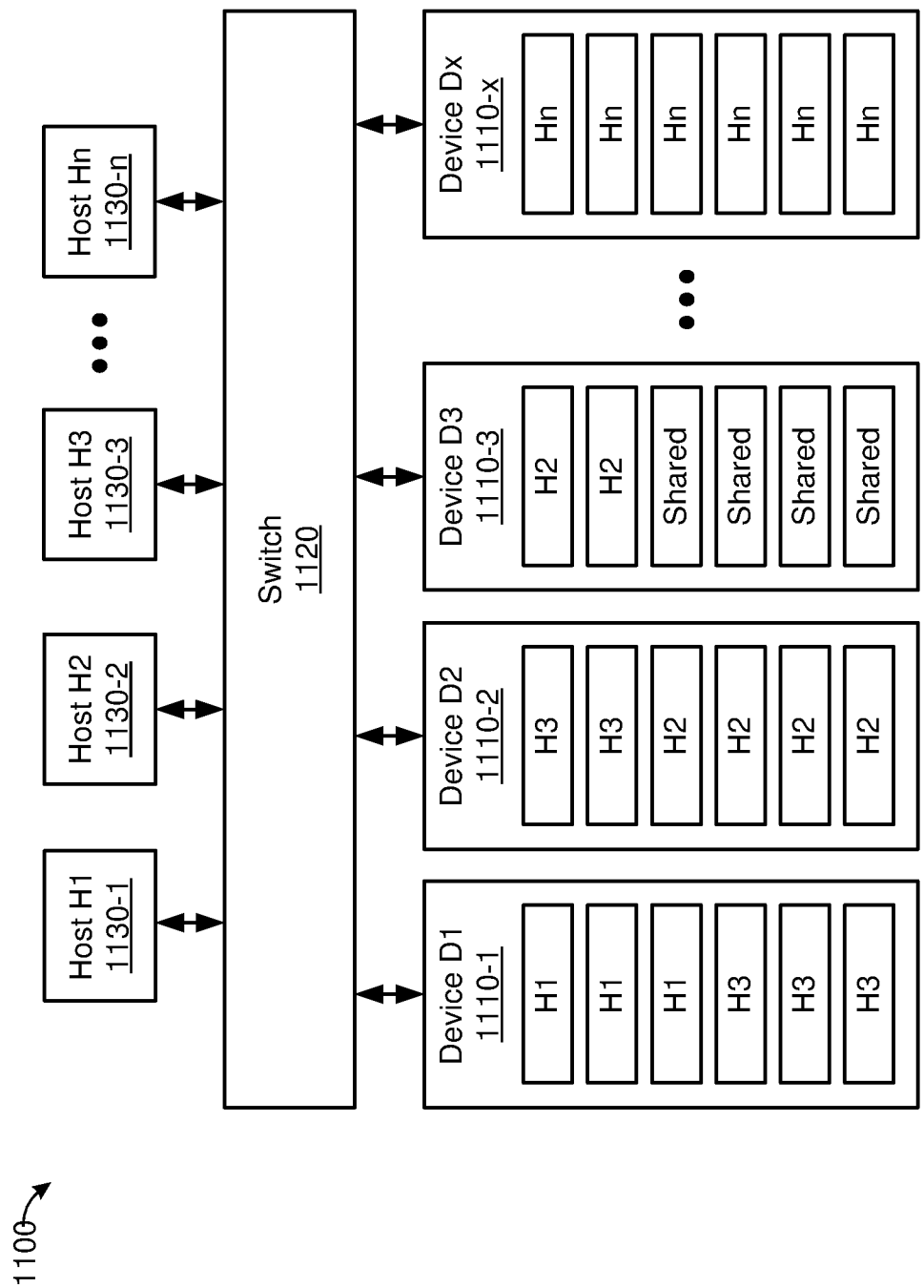
FIG. 11 is a block diagram of another example system in accordance with an embodiment.

Referring now to FIG. 11, shown is a block diagram of another example system in accordance with an embodiment. In FIG. 11, system 1100 may be all or part of a rack-based server having multiple hosts in the form of compute drawers that may couple to pooled memory via one or more switches.

As shown, multiple hosts 1130-1-*n* (also referred to herein as "hosts 1130") are present. Each host may be implemented as a compute drawer having one or more SoCs, memory, storage, interface circuitry and so forth. In one or more embodiments, each host 1130 may include one or more virtual hierarchies corresponding to different cache coherence domains. Hosts 1130 may couple to a switch 1120, which may be implemented as a UCIe or CXL switch (e.g., a CXL 2.0 (or later) switch). In an embodiment, each host 1130 may couple to switch 1120 using an off-package interconnect, e.g., a UCIe interconnect running a CXL protocol through at least one UCIe retimer (which may be present in one or both of hosts 1130 and switch 1120).

Switch 1120 may couple to multiple devices 1110-1-*x* (also referred to herein as "device 1110"), each of which may be a memory device (e.g., a Type 3 CXL memory expansion device) and/or an accelerator. In the illustration of FIG. 11, each device 1110 is shown as Type 3 memory device having any number of memory regions (e.g., defined partitions, memory ranges, etc.). Depending on configuration and use case, certain devices 1110 may include memory regions assigned to particular hosts while others may include at least some memory regions designated as shared memory. Although embodiments are not limited in this regard, the memory included in devices 1110 may be implemented with any type(s) of computer memory (e.g., dynamic random-access memory (DRAM), static random-access memory (SRAM), non-volatile memory (NVM), a combination of DRAM and NVM, etc.).

Figure 12:
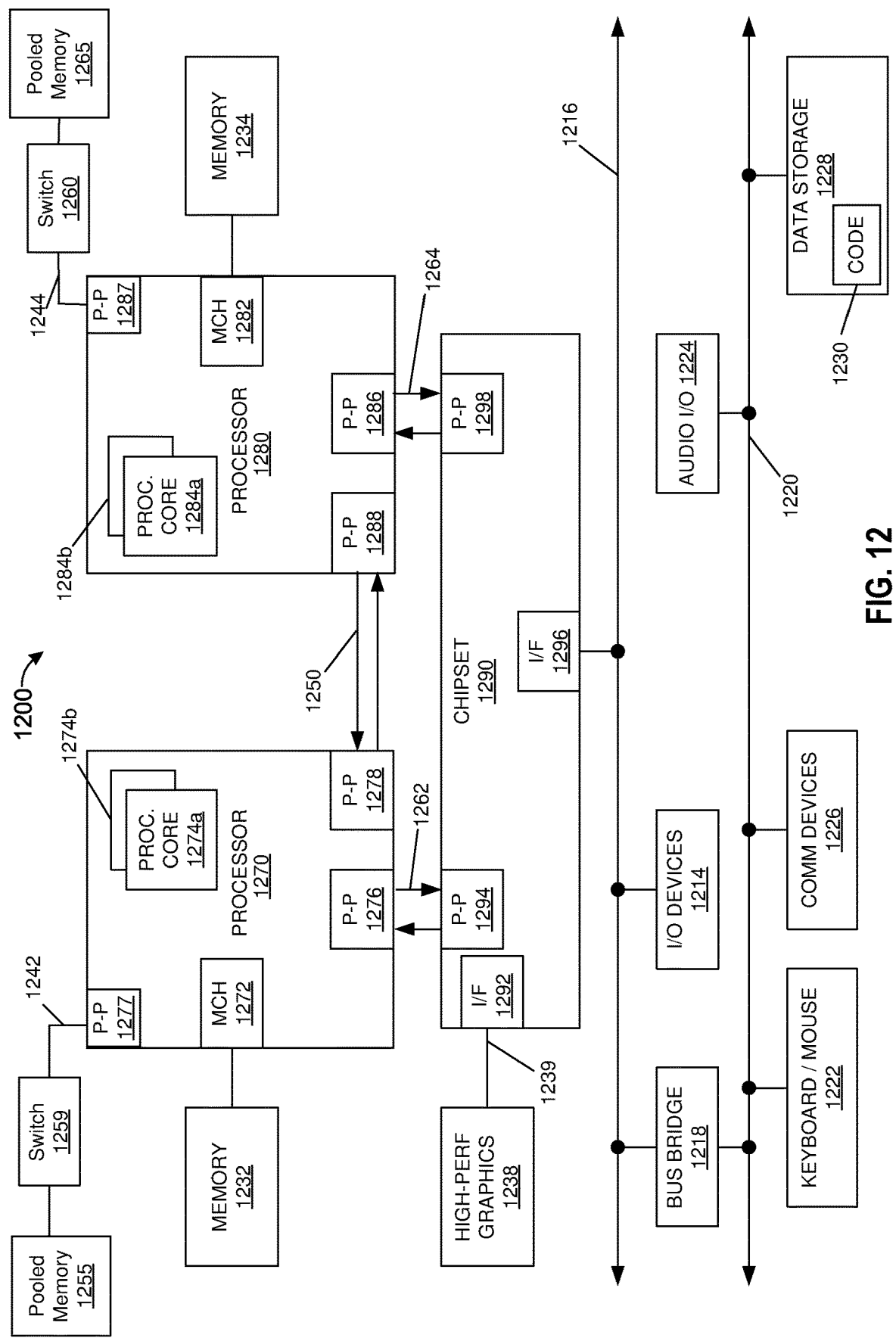
FIG. 12 is a block diagram of a system in accordance with another embodiment such as an edge platform.

Referring now to FIG. 12, shown is a block diagram of a system in accordance with another embodiment such as an edge platform. As shown in FIG. 12, multiprocessor system 1200 includes a first processor 1270 and a second processor 1280 coupled via an interconnect 1250, which can be a UCIe interconnect in accordance with an embodiment running a coherency protocol. As shown in FIG. 12, each of processors 1270 and 1280 may be many core processors including representative first and second processor cores (i.e., processor cores 1274*a* and 1274*b* and processor cores 1284*a* and 1284*b*).

In the embodiment of FIG. 12, processors 1270 and 1280 further include point-to point interconnects 1277 and 1287, which couple via interconnects 1242 and 1244 (which may be UCIe links in accordance with an embodiment) to switches 1259 and 1260. In turn, switches 1259, 1260 couple to pooled memories 1255 and 1265 (e.g., via UCIe links).

Still referring to FIG. 12, first processor 1270 further includes a memory controller hub (MCH) 1272 and point-to-point (P-P) interfaces 1276 and 1278. Similarly, second processor 1280 includes a MCH 1282 and P-P interfaces 1286 and 1288. As shown in FIG. 12, MCH's 1272 and 1282 couple the processors to respective memories, namely a memory 1232 and a memory 1234, which may be portions of system memory (e.g., DRAM) locally attached to the respective processors. First processor 1270 and second processor 1280 may be coupled to a chipset 1290 via P-P interconnects 1276 and 1286, respectively. As shown in FIG. 12, chipset 1290 includes P-P interfaces 1294 and 1298.

Furthermore, chipset 1290 includes an interface 1292 to couple chipset 1290 with a high performance graphics engine 1238, by a P-P interconnect 1239. As shown in FIG. 12, various input/output (I/O) devices 1214 may be coupled to first bus 1216, along with a bus bridge 1218 which couples first bus 1216 to a second bus 1220. Various devices may be coupled to second bus 1220 including, for example, a keyboard/mouse 1222, communication devices 1226 and a data storage unit 1228 such as a disk drive or other mass storage device which may include code 1230, in one embodiment. Further, an audio I/O 1224 may be coupled to second bus 1220.

Figure 13:
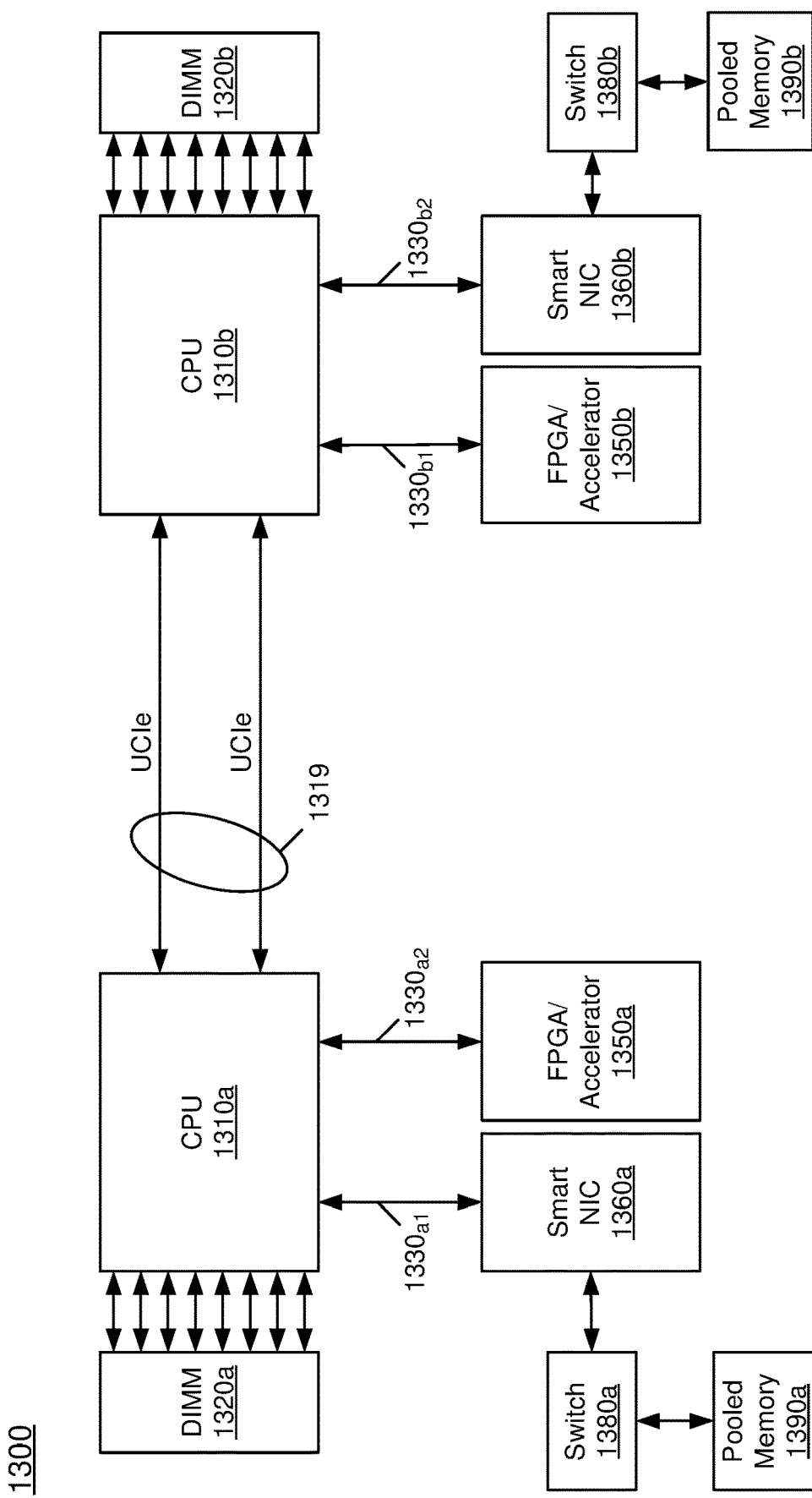
FIG. 13 is a block diagram of a system in accordance with another embodiment.

Referring now to FIG. 13, shown is a block diagram of a system 1300 in accordance with another embodiment. As shown in FIG. 13, system 1300 may be any type of computing device, and in one embodiment may be a server system. In the embodiment of FIG. 13, system 1300 includes multiple CPUs 1310a,b that in turn couple to respective system memories 1320a,b which in embodiments may be implemented as DIMMs such as double data rate (DDR) memory, persistent or other types of memory. Note that CPUs 1310 may couple together via an interconnect system 1315 such as an UCIe or other interconnect implementing a coherency protocol.

To enable coherent accelerator devices and/or smart adapter devices to couple to CPUs 1310 by way of potentially multiple communication protocols, a plurality of interconnects 1330a1-b2 may be present. Each interconnect 1330 may be a given instance of a UCIe link in accordance with an embodiment.

In the embodiment shown, respective CPUs 1310 couple to corresponding field programmable gate arrays (FPGAs)/accelerator devices 1350a,b (which may include GPUs, in one embodiment). In addition CPUs 1310 also couple to smart NIC devices 1360a,b. In turn, smart NIC devices 1360a,b couple to switches 1380a,b (e.g., CXL switches in accordance with an embodiment) that in turn couple to a pooled memory 1390a,b such as a persistent memory. In embodiments, various components shown in FIG. 13 may implement circuitry to perform techniques as described herein.

The following examples pertain to further embodiments.

In one example, an apparatus comprises: a first die comprising: a die-to-die adapter to communicate with a protocol layer and physical layer circuitry, where the die-to-die adapter is to receive message information, the message information comprising first information of a first interconnect protocol; and the physical layer circuitry coupled to the die-to-die adapter. The physical layer circuitry is to receive and output the first information to a second die via an interconnect. The physical layer circuitry comprises: a first sideband data receiver to couple to a first sideband data lane and a first sideband clock receiver to couple to a first sideband clock lane; and a second sideband data receiver to couple to a second sideband data lane and a second sideband clock receiver to couple to a second sideband clock lane, where the physical layer circuitry is to assign a functional sideband comprising: one of the first sideband data lane or the second sideband data lane; and one of the first sideband clock lane or the second sideband clock lane.

In an example, the physical layer circuitry: in response to a first result generated during a sideband initialization, is to assign the first sideband data lane and the first sideband clock lane as the functional sideband; and in response to a second result generated during the sideband initialization, is to assign the first sideband data lane and the second sideband clock lane as the functional sideband.

In an example, during the sideband initialization, the physical layer circuitry is to disable a mainband interface.

In an example, the second sideband data lane and the second sideband clock lane comprise a redundant sideband pair.

In an example, the physical layer circuitry is to receive a sideband message comprising a functional assignment and in response to the functional assignment to assign a redundant sideband lane to be part of the functional sideband.

In an example, the apparatus further comprises a package comprising the first die and the second die, where the interconnect comprises an on-package interconnect to couple the first die and the second die.

In an example, the apparatus further comprises a package substrate, the package substrate comprising the on-package interconnect adapted within a silicon bridge.

In an example, the apparatus further comprises an interposer, the interposer comprising the on-package interconnect.

In an example, the interconnect comprises a multi-protocol capable interconnect having a UCIe architecture, the first interconnect protocol comprising a flit mode of a PCIe protocol and the interconnect further to communicate second information of a second interconnect protocol, the second interconnect protocol comprising a flit mode of a CXL protocol.

In another example, a method comprises: receiving, in a first die of a package comprising the first die and a second die, from the second die, a sideband initialization packet having a predetermined pattern via a first sideband data lane and a second sideband data lane; receiving, in the first die from the second die, a sideband clock signal via a first sideband clock lane and a second sideband clock lane; sampling the sideband initialization packet received via the first sideband data lane with the sideband clock signal received via the first sideband clock lane and with the sideband clock signal received via the second sideband clock lane to generate a first result and a second result; sampling the sideband initialization packet received via the second sideband data lane with the sideband clock signal received via the first sideband clock lane and with the sideband clock signal received via the second sideband clock lane to generate a third result and a fourth result; based on at least one of the first result, the second result, the third result, or the fourth result: assigning one of the first sideband data lane or the second sideband data lane to be a functional sideband data lane; and assigning one of the first sideband clock lane or the second sideband clock lane to be a functional sideband clock lane; and sending a sideband message to the second die to indicate the assignment of the functional sideband data lane and the functional sideband clock lane.

In an example, the method further comprises: generating the first result having a first value in response to detection of the predetermined pattern by sampling the sideband initialization packet received via the first sideband data lane with the sideband clock signal received via the first sideband clock lane; and generating the first result having a second value in response to no detection of the predetermined pattern by sampling the sideband initialization packet received via the first sideband data lane with the sideband clock signal received via the first sideband clock lane.

In an example, the method further comprises based on the first result having the first value: assigning a functional sideband comprising the first sideband data lane and the first sideband clock lane; and assigning a redundant sideband comprising the second sideband data lane and the second sideband clock lane.

In an example, the other one of the first sideband data lane and the second sideband data lane and the other one of the first sideband clock lane and the second sideband clock lane comprises a redundant sideband pair.

In an example, the method further comprises: sending, from the first die to the second die, a plurality of iterations of the sideband initialization packet having the predetermined pattern via a third sideband data lane and a fourth sideband data lane; and sending, from the first die to the second die, during the plurality of iterations of the sideband initialization packet the sideband clock signal via a third sideband clock lane and a fourth sideband clock lane.

In an example, sending the plurality of iterations comprises: sending a first sideband initialization packet of the plurality of iterations of the sideband initialization packet; sending a data low signal for a plurality of unit intervals; and sending a second sideband initialization packet of the plurality of iterations of the sideband initialization packet.

In an example, the method further comprises after detecting the predetermined pattern, stopping sending the plurality of iterations of the sideband initialization packet.

In another example, a computer readable medium including instructions is to perform the method of any of the above examples.

In a further example, a computer readable medium including data is to be used by at least one machine to fabricate at least one integrated circuit to perform the method of any one of the above examples.

In a still further example, an apparatus comprises means for performing the method of any one of the above examples.

In yet another example, a package comprises a first die comprising a CPU and a protocol stack comprising: a die-to-die adapter to communicate with a protocol layer via a FDI and physical layer circuitry via a RDI, where the die-to-die adapter is to communicate message information, the message information comprising first information of a first interconnect protocol; and the physical layer circuitry coupled to the die-to-die adapter via the RDI. The physical layer circuitry is to receive and output the first information to a second die via an interconnect and is to: perform a sideband initialization of a sideband interface of the interconnect to: detect presence of activity of the second die; train the sideband interface; and send and receive an out of reset message via the sideband interface; and perform a mainband initialization of a mainband interface of the interconnect. The package may further include the second die coupled to the first die via the interconnect.

In an example, during the sideband initialization, the physical layer circuitry is to: send a plurality of first sideband packets to the second die, the plurality of first sideband packets comprising a predetermined data pattern; receive a plurality of second sideband packets from the second die, the plurality of second sideband packets comprising the predetermined data pattern; after detection of the predetermined data pattern in at least two of the plurality of second sideband packets: enable a sideband receiver to receive first sideband messages; and enable a sideband transmitter to send second sideband messages.

In an example, the physical layer circuitry is to perform the sideband initialization after a reset flow for the first die that is independent of a reset flow for the second die.

In an example, the second die comprises an accelerator, where the first die is to communicate with the second die according to at least one of a flit mode of a PCIe protocol or a flit mode of a CXL protocol.

In a still further example, an apparatus comprises: means for receiving a sideband initialization packet having a predetermined pattern via a first sideband data lane means and a second sideband data lane means; means for receiving a sideband clock signal via a first sideband clock lane means and a second sideband clock lane means; means for sampling the sideband initialization packet received via the first sideband data lane means with the sideband clock signal received via the first sideband clock lane means and with the sideband clock signal received via the second sideband clock lane means for generating a first result and a second result; means for sampling the sideband initialization packet received via the second sideband data lane means with the sideband clock signal received via the first sideband clock lane means and with the sideband clock signal received via the second sideband clock lane means for generating a third result and a fourth result; means for assigning one of the first sideband data lane means or the second sideband data lane means to be a functional sideband data lane means, based on at least one of the first result, the second result, the third result, or the fourth result; means for assigning one of the first sideband clock lane means or the second sideband clock lane means to be a functional sideband clock lane means based on the at least one of the first result, the second result, the third result, or the fourth result; and means for sending a sideband message to indicate the assignment of the functional sideband data lane means and the functional sideband clock lane means.

In an example, the apparatus further comprises: means for generating the first result having a first value in response to detection of the predetermined pattern by sampling the sideband initialization packet received via the first sideband data lane means with the sideband clock signal received via the first sideband clock lane means; and means for generating the first result having a second value in response to no detection of the predetermined pattern by sampling the sideband initialization packet received via the first sideband data lane means with the sideband clock signal received via the first sideband clock lane means.

In an example, the apparatus further comprises: means for assigning a functional sideband comprising the first sideband data lane means and the first sideband clock lane means based on the first result having the first value; and means for assigning a redundant sideband comprising the second sideband data lane means and the second sideband clock lane means based on the first result having the first value.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
   a first die comprising:
      a die-to-die adapter to communicate with a protocol layer and physical layer circuitry, wherein the die-to-die adapter is to receive message information, the message information comprising first information of a first interconnect protocol; and
      the physical layer circuitry coupled to the die-to-die adapter, wherein the physical layer circuitry is to receive and output the first information to a second die via an interconnect,
      wherein the physical layer circuitry comprises:
         a first sideband data receiver to couple to a first sideband data lane and a first sideband clock receiver to couple to a first sideband clock lane; and
         a second sideband data receiver to couple to a second sideband data lane and a second sideband clock receiver to couple to a second sideband clock lane,
      wherein the physical layer circuitry is to assign a functional sideband comprising:
         one of the first sideband data lane or the second sideband data lane; and
         one of the first sideband clock lane or the second sideband clock lane.

2. The apparatus of claim 1, wherein the physical layer circuitry:
   in response to a first result generated during a sideband initialization, is to assign the first sideband data lane and the first sideband clock lane as the functional sideband; and
   in response to a second result generated during the sideband initialization, is to assign the first sideband data lane and the second sideband clock lane as the functional sideband.

3. The apparatus of claim 2, wherein during the sideband initialization, the physical layer circuitry is to disable a mainband interface.

4. The apparatus of claim 1, wherein the second sideband data lane and the second sideband clock lane comprise a redundant sideband pair.

5. The apparatus of claim 1, wherein the physical layer circuitry is to receive a sideband message comprising a functional assignment and in response to the functional assignment to assign a redundant sideband lane to be part of the functional sideband.

6. The apparatus of claim 1, further comprising a package comprising the first die and the second die, wherein the interconnect comprises an on-package interconnect to couple the first die and the second die.

7. The apparatus of claim 6, further comprising a package substrate, the package substrate comprising the on-package interconnect adapted within a silicon bridge.

8. The apparatus of claim 6, further comprising an interposer, the interposer comprising the on-package interconnect.

9. The apparatus of claim 1, wherein the interconnect comprises a multi-protocol capable interconnect having a Universal Chiplet Interconnect express (UCIe) architecture, the first interconnect protocol comprising a flit mode of a Peripheral Component Interconnect express (PCIe) protocol and the interconnect further to communicate second information of a second interconnect protocol, the second interconnect protocol comprising a flit mode of a Compute Express Link (CXL) protocol.

10. A method comprising:
   receiving, in a first die of a package comprising the first die and a second die, from the second die, a sideband initialization packet having a predetermined pattern via a first sideband data lane and a second sideband data lane;
   receiving, in the first die from the second die, a sideband clock signal via a first sideband clock lane and a second sideband clock lane;
   sampling the sideband initialization packet received via the first sideband data lane with the sideband clock signal received via the first sideband clock lane and with the sideband clock signal received via the second sideband clock lane to generate a first result and a second result;
   sampling the sideband initialization packet received via the second sideband data lane with the sideband clock signal received via the first sideband clock lane and with the sideband clock signal received via the second sideband clock lane to generate a third result and a fourth result;
   based on at least one of the first result, the second result, the third result, or the fourth result:
      assigning one of the first sideband data lane or the second sideband data lane to be a functional sideband data lane; and assigning one of the first sideband clock lane or the second sideband clock lane to be a functional sideband clock lane; and sending a sideband message to the second die to indicate the assignment of the functional sideband data lane and the functional sideband clock lane.

11. The method of claim 10, further comprising:

generating the first result having a first value in response to detection of the predetermined pattern by sampling the sideband initialization packet received via the first sideband data lane with the sideband clock signal received via the first sideband clock lane; and generating the first result having a second value in response to no detection of the predetermined pattern by sampling the sideband initialization packet received via the first sideband data lane with the sideband clock signal received via the first sideband clock lane.

12. The method of claim 11, further comprising based on the first result having the first value:

assigning a functional sideband comprising the first sideband data lane and the first sideband clock lane; and assigning a redundant sideband comprising the second sideband data lane and the second sideband clock lane.

13. The method of claim 10, wherein the other one of the first sideband data lane and the second sideband data lane and the other one of the first sideband clock lane and the second sideband clock lane comprises a redundant sideband pair.

14. The method of claim 10, further comprising:

sending, from the first die to the second die, a plurality of iterations of the sideband initialization packet having the predetermined pattern via a third sideband data lane and a fourth sideband data lane; and sending, from the first die to the second die, during the plurality of iterations of the sideband initialization packet the sideband clock signal via a third sideband clock lane and a fourth sideband clock lane.

15. The method of claim 14, wherein sending the plurality of iterations comprises:

sending a first sideband initialization packet of the plurality of iterations of the sideband initialization packet;

sending a data low signal for a plurality of unit intervals; and sending a second sideband initialization packet of the plurality of iterations of the sideband initialization packet.

16. The method of claim 14, further comprising after detecting the predetermined pattern, stopping sending the plurality of iterations of the sideband initialization packet.

17. A package comprising:

a first die comprising a central processing unit (CPU) and a protocol stack comprising:

a die-to-die adapter to communicate with a protocol layer via a flit-aware die-to-die interface (FDI) and physical layer circuitry via a raw die-to-die interface (RDI), wherein the die-to-die adapter is to communicate message information, the message information comprising first information of a first interconnect protocol; and the physical layer circuitry coupled to the die-to-die adapter via the RDI, wherein the physical layer circuitry is to receive and output the first information to a second die via an interconnect, wherein the physical layer circuitry is to:

perform a sideband initialization of a sideband interface of the interconnect to:

detect presence of activity of the second die;

train the sideband interface; and send and receive an out of reset message via the sideband interface; and perform a mainband initialization of a mainband interface of the interconnect; and the second die coupled to the first die via the interconnect.

18. The package of claim 17, wherein during the sideband initialization, the physical layer circuitry is to:

send a plurality of first sideband packets to the second die, the plurality of first sideband packets comprising a predetermined data pattern;

receive a plurality of second sideband packets from the second die, the plurality of second sideband packets comprising the predetermined data pattern;

after detection of the predetermined data pattern in at least two of the plurality of second sideband packets:

enable a sideband receiver to receive first sideband messages; and enable a sideband transmitter to send second sideband messages.

19. The package of claim 18, wherein the physical layer circuitry is to perform the sideband initialization after a reset flow for the first die that is independent of a reset flow for the second die.

20. The package of claim 17, wherein the second die comprises an accelerator, wherein the first die is to communicate with the second die according to at least one of a flit mode of a Peripheral Component Interconnect express (PCIe) protocol or a flit mode of a Compute Express Link (CXL) protocol.

* * * * *